(12) United States Patent
Hamada

(10) Patent No.: US 6,353,494 B1
(45) Date of Patent: Mar. 5, 2002

(54) OPTICAL VOLTAGE SENSOR

(75) Inventor: Hidenobu Hamada, Amagasaki (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 0 days.

(21) Appl. No.: 09/628,561

(22) Filed: Jul. 28, 2000

(30) Foreign Application Priority Data

Jul. 29, 1999 (JP) .................................. 11-215798

(51) Int. Cl.[7] .................................................. G02F 1/00
(52) U.S. Cl. ...................... 359/322; 359/245; 359/246; 324/72; 324/96
(58) Field of Search ........................ 359/245, 246, 359/255, 256, 321, 249, 250, 251, 254, 257, 258; 385/11, 12

(56) References Cited

U.S. PATENT DOCUMENTS 5,734,263 A * 3/1998 Ryczek et al. ................ 324/96
6,008,927 A * 3/1998 Minemoto et al. .......... 359/245
5,748,392 A    5/1998 Hamada

FOREIGN PATENT DOCUMENTS

| JP | 3-44562 | 2/1991 |
| JP | 7-248339 | 9/1995 |
| JP | 8-220149 | 8/1996 |
| JP | 9-145745 | 6/1997 |

* cited by examiner

Primary Examiner—Georgia Epps
Assistant Examiner—Tuyen Tra
(74) Attorney, Agent, or Firm—Wenderoth, Lind & Ponack, L.L.P.

(57) ABSTRACT

In an optical voltage sensor which comprises a sensor part having a polarizer 1, a crystal λ/4 plate 2, a LiNbO$_3$ crystal 3, and an analyzer 4, a light emission part 10 emitting a light beam to the sensor part through an optical fiber, and a light reception part 12 for receiving the light beam having passed the sensor part through another optical fiber, the optical fiber used therein is a type having a core diameter allowing the beam to satisfy a range of 0.8 to 1.4° for a beam edge angle of the beam on the LiNbO$_3$ crystal. Alternatively, another type of optical fiber may be used in the light reception part 12, having a core diameter or NA which allows the light reception part 12 to selectively receive only partial beams satisfying the range of 0.8 to 1.4° for the beam edge angle of the beam on the LiNbO$_3$ crystal. With such structure, the optical voltage sensor can have improved temperature dependence and can be manufactured with ease and low cost.

25 Claims, 22 Drawing Sheets

FIG. 5

| PARAMETER | BEAM STRAND | | | TEMPERATURE :T | BEAM | | | |
|---|---|---|---|---|---|---|---|---|
| | TIME: t | BEAM ANGULAR DEVIATION FROM OPTICAL AXIS $\alpha_d$ | BEAM ANGULAR DEVIATION ON OPTICAL PLANE $\beta_d$ | APPLIED VOLTAGE :V₀ | | BEAM ANGULAR DEVIATION FROM OPTICAL AXIS $\alpha_c$ | BEAM ANGULAR DEVIATION ON OPTICAL PLANE $\beta_c$ | BEAM EDGE ANGLE $\theta_{co}$ |
| RANGE | ONE PERIOD FOR FUNDAMENTAL FREQUENCY | 0~2[°] | 0~360[°] | 0~10k[V] | -20~80[°C] | 0~2[°] | 0~360[°] | 0~2.8[°] |
| NUMBER | 16~64 | 40 | 90 | 12 | 10 | 40 | 90 | 10 |

OPTICAL VOLTAGE SENSOR

BACKGROUND OF THE INVENTION

1. Field of the Invention

The present invention relates to an optical voltage sensor for detecting voltages of power transmission lines or of distribution lines, or power-supply voltages to drive motors, or the like.

2. Description of the Background Art

FIG. 21 is a perspective front view showing a conventional optical voltage sensor simplified in structure. The optical voltage sensor includes a sensor part, a light emission part, a light reception part, and signal processing circuits provided each on the light emission and reception sides (both not shown). The sensor part has a polarizer 1, a quarter wavelength plate (or "$\lambda/4$ plate") 2, an electro-optic crystal 3, and an analyzer 4 arranged in order of light incidence on an optical axis. The light emission part includes an E/O circuit including a light emitting element such as LED (Light Emitting Diode) used as a light source. The light emission part is also provided with an input side optical system including an optical fiber 32a, a ferrule 38a, a GRIN lens 33a, and a holder 28a, all of which are arranged on an optical axis. As to these optical components, optical axis planes adjacent to each other are bonded by an adhesive. The light reception part is structured by an output side optical system in the same manner as with the input side optical system, and an O/E circuit in which an optical signal emitted from the output side optical system is converted into an electrical signal with a converting element.

As described above, as to the optical components arranged on the optical axis in the sensor part of the above-described optical voltage sensor, i.e., the polarizer 1, the $\lambda/4$ plate 2, the electro-optic crystal 3, and the analyzer 4, the optical axis planes adjacent to each other are bonded by the adhesive. The optical axis planes herein mean planes perpendicular to the respective optical axes, and each optical component has two planes where light comes in and goes out (the same is applicable to the below). Onto the electro-optic crystal 3, a pair of electrodes 35 are evaporated. The electrodes 35 are electrically connected to a pair of electrode terminals 24, respectively, via lead wires 34. A voltage is applied to between the electrode terminals 24 and is measured by the optical voltage sensor.

The signal processing circuits each provided on the light emission and reception sides are connected to the sensor part via the light emission and reception parts, respectively. The input-side optical axis plane of the polarizer 1 in the sensor part is fixed by the adhesive to the optical axis plane of the GRIN lens 33a, while the output-side optical axis plane of the analyzer 4 in the sensor part to the optical axis plane of a GRIN lens 33b. The sensor part, the input side optical system in the light emission part, and the output side optical system in the light reception part all fixed by the adhesive are mechanically fixed in a case (not shown). As the adhesive for the optical components is used an resin selected from among epoxy resins, urethane base resins, and the like.

In the optical voltage sensor, as the electro-optic crystal 3 is used a crystal such as $Bi_{12}SiO_{20}$(BSO), KDP, or $LiNbO_3$ or $LiTaO_3$ having natural birefringence property.

Next, the operational principle of the optical voltage sensor will be described by referring to FIG. 1. When an LED having a center wavelength of 0.85 $\mu$m is exemplarily used as a light source in the light emission part, an unpolarized light 7 of the LED emitted from a light emission part 10 becomes linearly polarized after having passed through the polarizer 1 in the sensor part. The linearly polarized light becomes circularly polarized after having passed through the $\lambda/4$ plate 2. The circularly polarized light then becomes elliptical according to a voltage Vm applied to the electro-optic crystal 3 after having passed therethrough. That is, the polarization state of the light passed through the electro-optic crystal 3 is changed by the applied voltage Vm. Such elliptically polarized light goes through the analyzer 4, and then reaches a light reception part 12 as an emitted light 8. The emitted light 8 varies in strength according to the polarization state of the light after having passed the electro-optic crystal 3. Since the polarization state is affected by the voltage Vm, it is possible to measure the voltage Vm outputted from the analyzer 4 by monitoring any change in strength in an optical receiver via the optical fiber 32b and then calculating modulation depth of optical power (strength). The modulation depth of optical power herein means a ratio of AC component to DC component of optical power.

Since the optical voltage sensor is usually used outdoors under severe conditions, a high performance in temperature dependence is required, more specifically, a change of modulation depth of ±1.0% or less is preferable at a temperature within a range of −20° C. to 80° C. Factors for the temperature dependence in the conventional optical voltage sensor include, for example, a change of refractive index due to stress applied to the bonded portions of the $\lambda/4$ plate 2 or the electro-optic crystal 3, and a temperature dependence due to birefringence property of the $\lambda/4$ plate. In the case that the $LiNbO_3$ crystal having natural birefringence property is used as the electro-optic crystal, the temperature dependence due to angular deviation of the incident light may also be included.

For betterment of such factors, the following methods are currently in use.

1. A method for reducing the temperature dependence of the electro-optic crystal by easing the stress applied thereto.

In this method, the electro-optic crystal is fixed without any adhesive so that the stress applied thereto is eased. This method is disclosed in Japanese Patent Laying-Open No. 9-145745 (97-145745)(U.S. Pat. No. 5,748,392).

2. A method for reducing the temperature dependence due to birefringence property of the $\lambda/4$ plate.

In this method, a zero-order single plate having temperature dependence lowered in degree is used as the $\lambda/4$ plate.

3. A method for reducing the temperature dependence due to natural birefringence property in the electro-optic crystal by reducing an angular deviation of the incident light.

In this method, the angular deviation of the light coming into the electro-optic crystal is reduced to 0.2° or less with a plane-making accuracy of the optical components, and whereby the temperature dependence due to the angular deviation of the incident light can be reduced. This method is disclosed in Japanese Patent Laying-Open No. 3-44562 (91-44562).

The first method is effective with ease of use. As to the second method, the zero-order single plate used as the $\lambda/4$ plate is expensive and fragile, and thereby requiring experience for handling to a considerable extent. Therefore, a low cost multilayered plate with ease of handling has been commonly used as the $\lambda/4$ plate. As shown in FIG. 22, its sensitivity converted as the modulation depth shows a relative change (relative sensitivity change with reference to the sensitivity at 25° C.) of ±1.5% or less at a temperature within a range of −20° C. to 80° C. The third method is easy to use, but reducing the angular deviation is not sufficient to stabilize characteristics. This is because the angular deviation may affect not only the angular deviation from the optical axis but also an angular deviation on the optical axis plane. As such, the temperature dependence of the conventional optical voltage sensor resulted from the stress is reduced, but not yet the temperature dependence about 1.5% of the λ/4 plate. Further, the temperature dependence of the optical voltage sensor remains unstable due to the angularly-deviated light coming into the electro-optic crystal.

As described above, the λ/4 plate having temperature dependence of about 1.5% is used in the conventional optical voltage sensor with consideration for productivity and cost. If the crystal such as $LiNbO_3$ with natural birefringence property is used therein, further, the temperature dependence gets unstable due to angular deviation. As a result, the conventional optical sensor suffers from unstable temperature dependence of about 1.5%.

To get around such problem, an optical sensor is disclosed in Japanese Patent Laying-Open No. 7-248339 (95-248339), which is of a type having a lens, a polarizer, a Pockels element, a wave plate, and an analyzer arranged on an optical path between a light source and a light reception part. The optical sensor is provided with means for adjusting an incident angle so that the incident light to the Pockels element is changed in angle according to the ambient temperature. With such optical sensor, the incident light to the Pockels element (electro-optic crystal) is changed in angle by temperature, and a change of output by the angle change and that by the temperature change cancel each other out. An output of the sensor is thus reduced in temperature dependence.

The above optical sensor, however, requires the means for adjusting the incident angle so that the incident light to the Pockels element is changed in angle according to the ambient light, which results in complicate structure, lower productivity, and higher cost. In addition, the angular deviation affects not only the angular deviation from the optical axis but also the angular deviation on the optical axis plane as described above, whereby adjustment for the incident angle, that is, the angular deviation from the optical axis is not sufficient to stabilize the temperature dependence.

SUMMARY OF THE INVENTION

Therefore, an object of the present invention is to provide an optical voltage sensor which has improved temperature dependence and is manufactured with ease and low cost.

The present invention has the following features to attain the object above.

A first aspect of the present invention is directed to an optical voltage sensor comprising: a light emission part for emitting a light beam; a sensor part having a polarizer, a λ/4 plate, an electro-optic crystal with a birefringence property, and an analyzer arranged on a predetermined optical axis set along an optical path of the light beam; and a light reception part for receiving the light beam which has passed the sensor part, and measuring a voltage applied to the electro-optic crystal based on the light beam received by the light reception part, wherein
based on an inherent relationship between a characteristic of the optical voltage sensor and at least one parameter indicating a beam center direction, a spread angle distribution, or a converging angle distribution for the beam coming into the electro-optic crystal, at least one of the parameters is set to a predetermined value in advance to improve the characteristic.

As described above, in the first aspect, the characteristic of the optical voltage sensor is improved by setting, to a predetermined value, at least one parameter indicating a beam center direction, a spread angle distribution, or a converging angle distribution for the beam coming into the electro-optic crystal. Accordingly, the optical voltage sensor can have improved temperature dependence and can be manufactured with ease and low cost. To reduce the temperature dependence, especially when the parameters are set in value based on an inherent relationship between the temperature dependence of the optical voltage sensor and the parameters, the voltage can be measured with accuracy without being affected by temperature change, and the temperature dependence can be easily controlled. As a result, the cost can be reduced. Further, with such optical voltage sensor having the temperature dependence reduced, there is no more need to use a zero-order single plate having temperature dependence lowered in degree as the λ/4 plate, or have a mechanism for adjusting the angular deviation depending on temperature change. Therefore, the optical voltage sensor can have improved temperature dependence and can be manufactured with ease and low cost.

According to a second aspect, in the first aspect,
the parameter indicating the beam center direction of the light beam includes an angular deviation from the optical axis and an angular deviation on an optical axis plane that is a plane perpendicular to the optical axis.

As described above, in the second aspect, the parameters include not only the angular deviation from the optical axis but also the angular deviation on the optical axis plane, and are set to improve the characteristic of the optical voltage sensor. Therefore, the temperature dependence, and the like, can be reduced more securely than in a conventional optical voltage sensor, and the uncertainty of the temperature dependence of the optical voltage sensor can be thus lessened.

According to a third aspect, in the first aspect,
the λ/4 plate is crystal,
the electro-optic crystal is a $LiNbO_3$ crystal whose Z axis is coincided with the optical axis,
a central wavelength of the light beam emitted from the light emission part is in a range of 0.8 to 0.9 μm, and
a beam edge angle of the light beam when coming into the electro-optic crystal is in a range of 0.8 to 1.4 degrees.

As described above, in the third aspect, the light beam satisfies the range of 0.8 to 1.4° for the beam edge angle when coming into the electro-optic crystal. Such light beam is a bundle of beam strands each differed in angular deviation from the optical axis and that on the optical axis plane, and the characteristic of the optical voltage sensor is determined as the sensitivity, and the like, in total for those beam strands. As such, by limiting the beam edge angle of the beam coming into the electro-optic crystal to be in the range of 0.8 to 1.4°, the optical voltage sensor can have improved temperature dependence and can be manufactured with ease and low cost.

According to a fourth aspect, in the first aspect,
at least one of the parameters is set to the predetermined value by selectively receiving the light beam which has reached the light reception part via the sensor part.

As described above, in the fourth aspect, the light reception part receives only the light beam satisfying at least one of the parameters in the predetermined value. Therefore, the same effects as in the first aspect can be obtained.

According to a fifth aspect, in the third aspect,
the light reception part comprises a light selective reception part for selectively receiving, out of the light beam coming into the light reception part via the sensor part, only a partial beam satisfying the range of 0.8 to 1.4 degrees for the beam edge angle on the LiNbO3 crystal being the electro-optic crystal.

As described above, in the fifth aspect, the light reception part receives only the partial beams satisfying the range of 0.8 to 1.4° for the beam edge angle on the LiNbO3 crystal being the electro-optic crystal. Therefore, as in the third aspect, the optical voltage sensor can have improved temperature dependence and can be manufactured with ease and low cost.

According to a sixth aspect, in the fifth aspect,
the light reception part comprises, as the light selective reception part, an optical fiber whose core diameter or numerical aperture allows to selectively receive only the partial beam.

As described above, in the sixth aspect, by selecting the core diameter or NA of the optical fiber, only the partial beams satisfying the range of 0.8 to 1.4° for the beam edge angle on the LiNbO3 crystal being the electro-optic crystal are received. Therefore, the optical voltage sensor can be implemented in a simple structure, with improved temperature dependence, and with ease and low cost for manufacturing.

According to a seventh aspect, in the fifth aspect,
the light reception part comprises, as the light selective reception part, a lens whose diameter or numerical aperture allows to selectively receive only the partial beam.

As described above, in the seventh aspect, by selecting the core diameter or NA of the lens, only the partial beams satisfying the range of 0.8 to 1.4° for the beam edge angle on the LiNbO3 crystal being the electro-optic crystal are received. Therefore, the optical voltage sensor can be implemented in a simple structure, with improved temperature dependence, and with ease and low cost for manufacturing.

According to an eighth aspect, in the third aspect,
the light emission part comprises an optical fiber through which the light beam passes, wherein
the optical fiber has a core diameter allowing the light beam to satisfy the range of 0.8 to 1.4 degrees for the beam edge angle on the LiNbO3 crystal being the electro-optic crystal.

As described above, in the eighth aspect, by selecting the core diameter of the optical fiber in the light emission part, the beam edge angle of the beam coming into the LiNbO3 crystal being the electro-optic crystal satisfies the range of 0.8 to 1.4°. Therefore, the optical voltage sensor can be implemented in a simple structure, with improved temperature dependence, and with ease and low cost for manufacturing.

According to a ninth aspect, in the third aspect,
the light emission part comprises:
a GRIN lens with about 0.25 pitch for a wavelength of the light; and
an optical fiber whose core diameter is in a range of 0.16 to 0.28 mm, wherein
the light beam is emitted to the sensor part through the optical fiber and then the GRIN lens.

As described above, in the ninth aspect, the core diameter of the optical fiber in the light emission part is in the range of 0.16 to 0.28 mm, and accordingly the beam edge angle of the light beam coming into the LiNbO3 crystal being the electro-optic crystal is in the range of about 0.8 to 1.4°. Therefore, as in the eighth aspect, the optical voltage sensor can be implemented in a simple structure, with improved temperature dependence, and with ease and low cost for manufacturing.

A tenth aspect of the present invention is directed to an optical voltage sensor comprising: a light emission part for emitting a light beam; a sensor part having a polarizer, a $\lambda/4$ plate, an electro-optic crystal with a birefringence property, and an analyzer arranged on a predetermined optical axis set along an optical path of the light beam; and a light reception part for receiving the light beam which has passed the sensor part, and measuring a voltage applied to the electro-optic crystal based on the light beam received by the light reception part, wherein,
when the polarizer and the analyzer are parallel to each other in polarizing direction, a center of the light beam in the light emission part is set in a position displaced by a predetermined distance in a first direction so that a fast axis of the electro-optic crystal having a birefringence property and a fast axis of the $\lambda/4$ plate having the birefringence property are perpendicular to each other on a reference plane of the light beam, and
when the polarizer and the analyzer are perpendicular to each other in polarizing direction, the center of the light beam in the light emission part is set in a position displaced by a predetermined distance in a second direction so that the fast axis of the electro-optic crystal having the birefringence property and the fast axis of the $\lambda/4$ plate having the birefringence property are parallel to each other on the reference plane of the light beam.

As described above, in the tenth aspect, the center of the light beam in the light emission part is displaced in a direction in which the fiber connection loss and the electro-optic crystal loss are cancelled out in terms of optical power. Therefore, the optical power to be received by the light reception part is reduced in variation resulted from the parts' tolerances, or the like.

According to an eleventh aspect, in the tenth aspect,
the light emission part comprises an optical fiber and a lens through which the light beam passes,
the center of the light beam in the light emission part is set by placing a center axis of a core of the optical fiber on a displaced position in the first or second directions parallel to an optical axis of the lens, and
the displaced position is a position where an optical power of the light beam to be received by the light reception part is maximum.

As described above, in the eleventh aspect, after the center axis of the core of the optical fiber is positionally set, the center of the light beam in the light emission part is displaced in a direction and a position where the fiber connection loss and the electro-optic crystal loss are cancelled out in terms of optical power. Therefore, the optical power to be received by the light reception p art is reduced in variation resulted from the parts' tolerances, or the like.

A twelfth aspect of the present invention is directed to an optical voltage sensor comprising: a light emission part for emitting a light beam; a sensor part having a polarizer, a $\lambda/4$ plate, an electro-optic crystal with a birefringence property, and an analyzer arranged on a predetermined optical axis set along an optical path of the light beam; and a light reception part for receiving the light beam which has passed the sensor part, and measuring a voltage applied to the electro-optic crystal based on the light beam received by the light reception part, wherein
the light reception part comprises a light selective reception part for selectively receiving, only a partial beam out of the light beam coming into the light reception part via the sensor part, wherein the light selective reception part selectively receives the partial beam, when the polarizer and the analyzer are parallel to each other in polarizing direction, in such manner that a fast axis of the electro-optic crystal having a birefringence property and a fast axis of the λ/4 plate having the birefringence property are approximately perpendicular to each other on a reference plane each for a plurality of beam strands structuring the partial beam, and when the polarizer and the analyzer are perpendicular to each other in polarizing direction, in such manner that the fast axis of the electro-optic crystal having the birefringence property and the fast axis of the λ/4 plate having the birefringence property are approximately parallel to each other on the reference plane each for the plurality of beam strands structuring the partial beam.

As described above, in the twelfth aspect, the light reception part receives the partial beams selected in such manner that the fiber connection loss and the electro-optic crystal loss are cancelled out in terms of optical power. Therefore, the optical power to be received by the light reception part is reduced in variation resulted from the parts' tolerances, or the like.

According to a thirteenth aspect, in the twelfth aspect, the light reception part comprises:
a lens through which the light beam passes; and
an optical fiber, as the light selective reception part, for selectively receiving the light beam which has passed through the lens, wherein
a center axis of a core of the optical fiber is placed on a displaced position in a direction where the partial beam is selectively received and parallel to an optical axis of the lens, and
the displaced position is a position where an optical power of the light beam to be received by the light reception part is maximum.

As described above, in the thirteenth aspect, by positionally setting (displaced position) the center axis of the core of the optical fiber in the light reception part, the light reception part receives the partial beams selected in such manner the fiber connection loss and the electro-optic crystal loss are cancelled out in terms of optical power. Therefore, the optical power to be received by the light reception part is reduced in variation resulted from the parts' tolerances, or the like.

According to a fourteenth aspect, in the first aspect,
the light emission part comprises:
a first lens;
a first holder in which the first lens is housed;
a first optical fiber which leads the light beam to the sensor part via the first lens; and
a first ferrule attached at the tip of the first optical fiber, inserted and fixed in the first holder, and provided with a recess on a portion not abutting to either the first lens or the first holder, wherein
optical axes are adjusted between the first optical fiber and the first lens with a mechanical accuracy for the first holder and the first ferrule, and
the light reception part comprises:
a second lens;
a second holder in which the second lens is housed;
a second optical fiber which leads the light beam coming from the sensor part via the second lens; and
a second ferrule which is attached at the tip of the second optical fiber, inserted and fixed in the second holder, and has a recess on a portion not abutting to either the second lens or the second holder, wherein
optical axes are adjusted between the second optical fiber and the second lens with the mechanical accuracy for the second holder and the second ferrule, and
the first and second holders and the first and second ferrules are integrated together by filling, for curing, an adhesive to a region enclosing the first and second holders and the first and second ferrules, and to the recesses on the first and second ferrules.

As described above, in the fourteenth aspect, the block is formed to integrate the first and second holders and the first and second ferrules together by filling, for curing, the adhesive to a region enclosing the first and second holders and the first and second ferrules. At the time of block firming, the recesses on the first and second ferrules are filled with the adhesive so as to be a part of the block. In this manner, the first and second ferrules are fixed in the first and second holders, thereby being prevented from falling off.

According to a fifteenth aspect, in the first aspect,
the light emission part comprises:
a first lens;
a first holder housing the first lens therein, and having a hole on a portion not abutting to the first lens;
a first optical fiber which leads the light beam to the sensor part via the first lens; and
a first ferrule attached at the tip of the first optical fiber, inserted and fixed in the first holder, and provided with a recess on a portion where the hole on the first holder coincides therewith, wherein
optical axes are adjusted between the first optical fiber and the first lens with a mechanical accuracy for the first holder and the first ferrule, and
the light reception part comprises:
a second lens;
a second holder housing the second lens therein, and having a hole on a portion not abutting to the second lens;
a second optical fiber which leads the light beam coming from the sensor part via the second lens; and
a second ferrule attached at the tip of the second optical fiber, inserted and fixed in the second holder, and provided with a recess on a portion where the hole on the second holder coincides therewith, wherein
optical axes are adjusted between the second optical fiber and the second lens with a mechanical accuracy for the second holder and the second ferrule, and
the first holder and the first ferrule are integrated together by filling, for curing, an adhesive to the hole on the first holder and the recess on the first ferrule, and the second holder and the second ferrule are integrated together by filling, for curing, an adhesive to the hole on the second holder and the recess on the second ferrule.

As described above, in the fifteenth aspect, the first holder and the first ferrule are integrated together by filling, for curing, the adhesive to the hole on the first holder and the recess on the first ferrule. Accordingly, the first ferrule is fixed in the first holder. The second holder and the second ferrule are integrated together in a similar manner, and the second ferrule is fixed in the second holder. Therefore, the first and second ferrules are prevented from falling off.

According to a sixteenth aspect, in the first aspect, the light emission part comprises:
a first lens;
a first holder housing the first lens, and including a hole on a portion not abutting to the first lens;
a first optical fiber which leads the light beam to the sensor part via the first lens; and
a first ferrule attached at the tip of the first optical fiber, inserted and fixed in the first holder, and provided with a recess on a portion where the hole on the first holder coincides therewith, wherein optical axes are adjusted between the first optical fiber and the first lens with a mechanical accuracy for the first holder and the first ferrule, and the light reception part comprises:
a second lens;
a second holder housing the second lens, and including a hole on a portion not abutting to the second lens;
a second optical fiber which leads the light beam coming from the sensor part via the second lens; and
a second ferrule attached at the tip of the second optical fiber, inserted and fixed in the second holder, and provided with a recess on a portion where the hole on the second holder coincided therewith, wherein optical axes are adjusted between the second optical fiber and the second lens with a mechanical accuracy of the second holder and the second ferrule, and the first and second holders and the first and second ferrules are integrated together by filling, for curing, an adhesive to a region enclosing the first and second holders and the first and second ferrules, and to the holes on the first and second holders and the recesses on the first and second ferrules.

As described above, in the sixteenth aspect, the block is formed to integrate the first and second holders and the first and second ferrules together by filling, for curing, the adhesive to a region enclosing the first and second holders and the first and second ferrules. At the time of block firming, the holes on the first and second holders and the recesses on the first and second ferrules are filled with the adhesive so as to be a part of the block. In this manner, the first and second ferrules are fixed in the first and second holders, thereby being prevented from falling off.

According to a seventeenth aspect, in fourteenth or sixteenth aspect, the adhesive is an inorganic adhesive having an inorganic material as a main ingredient, and portions of the first and second holders and the first and second ferrules where abutting to the adhesive are made of the inorganic material.

As described above, in the seventeenth aspect, as the adhesive for integrating the holder and ferrule together is used the inorganic adhesive. Further, any portion of the holder and ferrule abutting to the adhesive is made of the inorganic material.

Accordingly, the thermal expansion coefficient for the block formed by the adhesive and that for the portions of the holder and ferrule abutting to the adhesive are approximately the same. As a result, it becomes possible to prevent any stress from occurring due to any difference of the thermal expansion coefficient therebetween, and thus the undesired temperature dependence is prevented. Further, the temperature dependence caused by the angular deviation due to thermal stress, for example, can be reduced.

According to an eighteenth aspect, in the seventeenth aspect, the adhesive is the inorganic adhesive whose thermal expansion coefficient after curing is $20 \times 10^{-6}/°$ C. or below.

These and other objects, features, aspects and advantages of the present invention will become more apparent from the following detailed description of the present invention when taken in conjunction with the accompanying drawings.

BRIEF DESCRIPTION OF THE DRAWINGS

FIG. 5 is a table showing parameters used in the optical voltage sensor simulation;

DESCRIPTION OF THE PREFERRED EMBODIMENTS

0. Base Study

Figure 1:
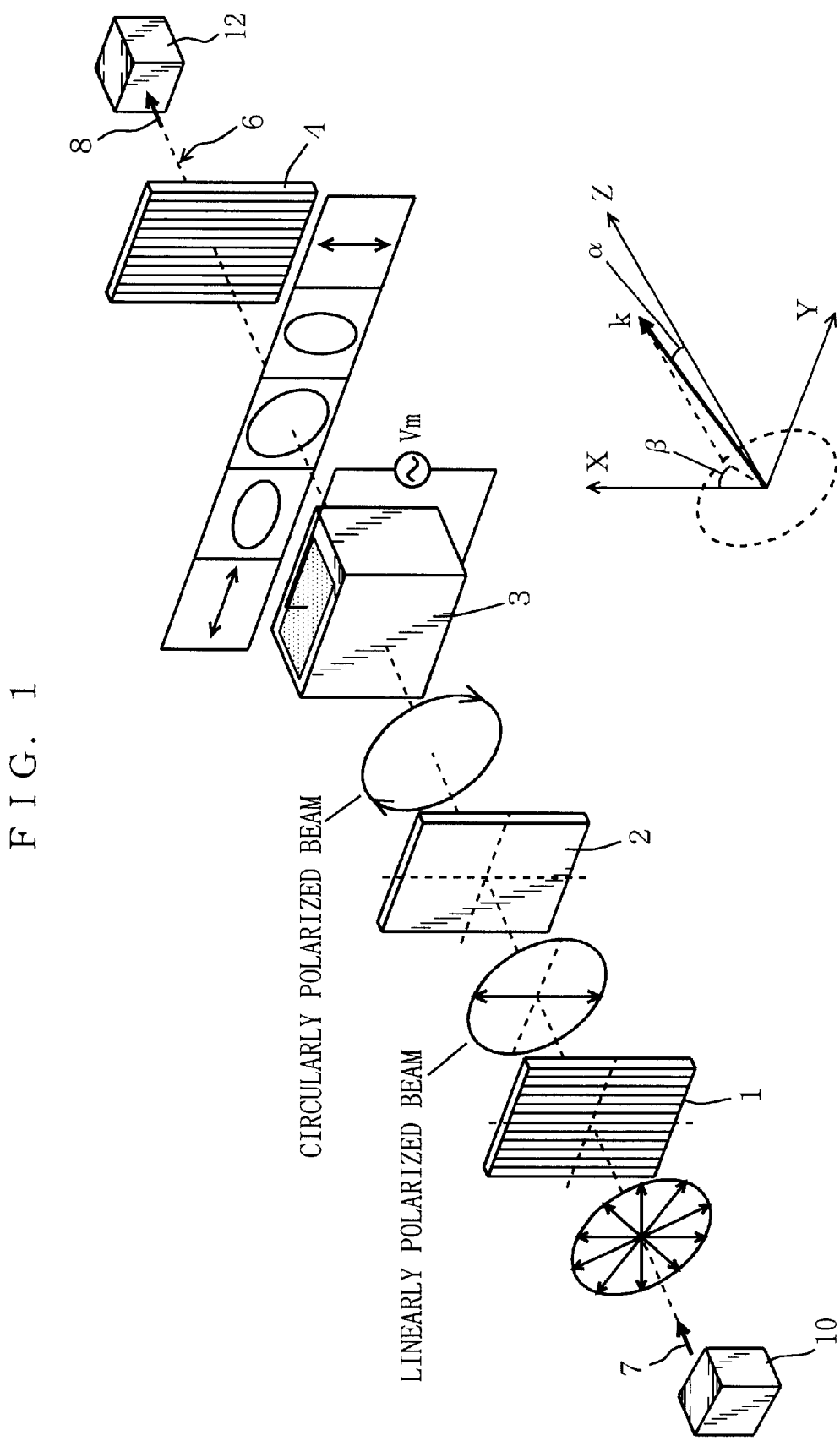
FIG. 1 is a diagram for explaining the operational principle of an optical voltage sensor.

In an optical voltage sensor of the present invention, to desirably set sensitivity or to improve sensitivity-temperature characteristic, parameters relevant to angular deviation are all set in proper value. Such parameters include angular deviation from the optical axis, angular deviation on the optical axis plane, or spread angle with respect to an optical axis of a beam coming into the electro-optic crystal $LiNbO_3$. This value setting requires data indicating the relationship (hereinafter, "angular deviation characteristics") between one or more parameters relevant to angular deviation and characteristics of the optical voltage sensor (e.g., sensitivity, sensitivity-temperature characteristic). For this purpose, as the base study to implement the optical voltage sensor, an inventor of this application has originated a model (hereinafter, "optical voltage sensor output computation model") for computing an output from the optical voltage sensor with respect to an optical beam in an arbitrary state to learn what value is proper for each parameter. A computer simulation (hereinafter, "optical voltage sensor simulation") based on the model is then done so that such data as above indicating the angular deviation characteristics is acquired. Prior to describing embodiments of the present invention, the optical voltage sensor output computation model and the optical voltage sensor simulation are described. Herein, any constituent in the optical voltage sensor being identical to that in the prior art is denoted by the same reference numeral.

FIG. 1 is a diagram showing the operational principle of the optical voltage sensor. Similarly to the conventional optical voltage sensor, the optical voltage sensor in FIG. 1 is provided with the sensor part, the light emission part 10, and the light reception part 12. The sensor part has the polarizer 1, the λ/4 plate 2, the electro-optic crystal 3, and the analyzer 4 arranged in order of light incidence on an optical axis. The electro-optic crystal 3 is provided with a pair of electrodes to which the voltage Vm is applied for measurement. The electro-optic crystal 3 implemented by any crystal having the birefringence property causes a principal axis direction thereof and a refractive index in that direction to both change. This is because the beam coming into the electro-crystal 3 may be angular-deviated from the optical axis or on the optical axis plane, or changed in spread angle with respect to the optical axis. Herein, a cross section of the index ellipsoid on the reference plane of the beam is an ellipse, a principal value of which indicates the refractive index for the beam. Accordingly, the ellipse is hereinafter referred to as "ellipse indicating the index refractive for the beam". The change in refractive index of the beam coming into the electro-optic crystal 3 accordingly leads to the change in polarization state of the beam therefrom, whereby an output from the analyzer 4 is changed in optical power.

<0.1 Optical Voltage Sensor Output Computation Model>

It is assumed that a beam is defined by a plurality of beam strands bundled together for the optical voltage sensor simulation process. Each beam strand is a minimum unit of the light beam, and is defined by optical power and direction in which the beam strand advances. Beam strand itself never spreads. A beam is assembled with beam strands having different directions from each other. Due to the directional difference among beam strands, the beam (bundled beam strands) spreads or converges with respect to the advancing axis thereof.

An integral of outputs of the optical voltage sensor with respect to the beam strands can be regarded, as an output with respect to the beam.

<0.2 Computation of Output of Optical voltage sensor>

<0.2.1 Output for Beam Strand>

Figure 2:
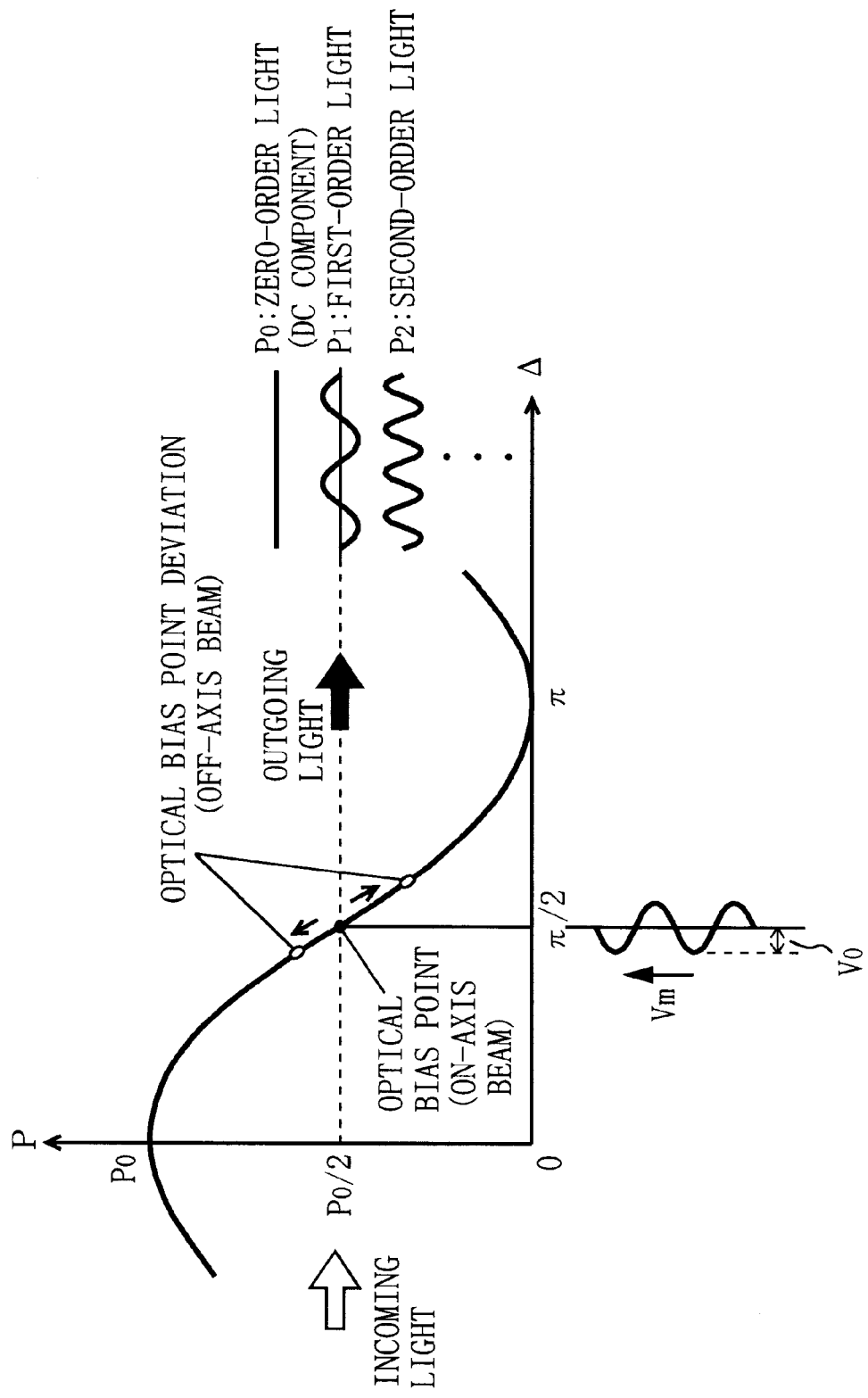
FIG. 2 is a diagram for explaining input/output characteristics of the optical voltage sensor shown in FIG. 1.

FIG. 2 is a diagram for explaining input/output characteristics of the optical voltage sensor shown in FIG. 1. The beam coming into the electro-optic crystal 3 is now resolved into two lights each oscillating in the principal direction of the ellipse indicating the index refractive for the beam. A phase difference between the resolved two lights (hereinafter, simply "phase difference") is denoted by "Δ". The phase difference Δ varies depending on how the beam is polarized, and thus the relationship between the phase difference Δ of the beam coming from the electro-optic crystal 3 to the analyzer 4 and the output P from the analyzer 4 (hereinafter, such relationship is referred to as "input/output characteristics of the optical voltage sensor", and a curve indicating the relationship as "characteristic curve of the optical voltage sensor") is as shown in FIG. 2. After having passed the λ/4 plate 2, the phase difference Δ of the beam coming into the electro-optic crystal 3 is now π/2. If no voltage Vm is applied to the electro-optic crystal 3, the phase difference Δ shows no change from π/2 after passing through the electro-optic crystal 3. With the voltage Vm applied, on the other hand, the phase difference Δ varies according thereto. Accordingly, if as the voltage Vm is applied an alternating voltage to the electro-optic crystal 3, such optical signal as fluctuating at an optical bias point where Δ=π/2 and P=P0/2 is outputted from the analyzer 4 (hereinafter, such optical signal is called "output from the optical voltage sensor"). Herein, it is assumed that no angular deviation is occurred in the beam strand coming into the electro-optic crystal 3.

As described above, when no angular deviation is observed in the beam strand coming into the electro-optic crystal 3, with the bias point where Δ=π/2 and P=P0/2 being a center point of linear part of the characteristic curve, the output from the optical voltage sensor is an optical signal modulated by the voltage (i.e., voltage Vm) applied to the electro-optic crystal 3. Herein, as shown in FIG. 2, if any angular deviation is occurred in the beam strand coming into the electro-optic crystal 3, the optical bias point moves on the characteristic curve of the optical voltage sensor. Consequently, a non-linear component included in the output from the optical voltage sensor is increased. The output P is expressed as follows:

$$P = (1/2) \cdot P0 \cdot (1 - \sin \Delta p \cdot \sin 2\Theta) \quad (1)$$

where Δp is a part of the phase difference Δ between lights each oscillating in the principal direction (fast axis and slow axis directions) of the ellipse indicating the refractive index for the beam strand coming into the electro-optic crystal 3, and is induced by the voltage Vm applied to the electro-optic sensor 3. That is, $$\Delta p = \Delta - \pi/2 \quad (2)$$

$$= (2\pi/\lambda)(n1 - n2)L$$

where n1 and n2 each indicate refractive index for the lights oscillating in the slow axis and fast axis directions, respectively of the ellipse which indicates the refractive index for the beam strand coming into the electro-optic crystal 3, and L indicates a length of the electro-optic crystal 3 in the optical axis direction, that is, in the light propagation direction. Further, Θ is an angle which indicates the principal axis direction of the ellipse indicating the refractive index for the beam strand coming into the electro-optic crystal 3, and is called "setting angle". Note that, the setting angle Θ is determined by birefringence due to angular deviation and voltage application.

The angular deviation of each beam strand can be expressed by, as shown in FIG. 1, an angular deviation from the optical axis α and an angular deviation on the optical axis plane β. Herein, the angular deviation from the optical axis α is an angle between the vector k denoting the beam strand and the optical axis (Z axis), while the angular deviation on the optical axis plane β is an angle between a vector obtained by projecting the vector k onto a plane perpendicular to the optical axis (optical axis plane) and a direction (X axis) of an applied electric field in the electro-optic crystal 3. Hereinafter, the angular deviation of each beam strand is denoted by "(α, β)". Determination factors for the birefringence property in the electro-optic crystal 3 with respect to any angularly-deviated beam strand are the birefringence caused by the beam strand angularly deviated by (α, β) (hereinafter, "birefringence due to angular deviation") and the birefringence caused by the voltage Vm applied to the electro-optic crystal 3 (hereinafter, "birefringence due to voltage"). If the voltage Vm varies with time, the birefringence due to angular deviation shows no change but the birefringence due to voltage, according to the voltage Vm. Therefore, the phase difference Δp and the setting angle Θ are functions of time t, and can be expressed by Δp(t) and Θ(t), respectively. Accordingly, the voltage Vm is presumably expressed as $$Vm = V0 \cdot \sin \omega t \quad (3)$$

and the output P of the optical voltage sensor in the equation (1) is expanded in a Fourier series as follows:

$$P = ps0 + ps1 \cdot \sin \omega t + ps2 \cdot \sin 2\omega t + \quad (4)$$

where ω is the frequency of the voltage Vm which is the fundamental frequency of the Fourier series.

Herein, the phase difference Δp in the equation (1) can be expressed by the equation (2), and the refractive indexes n1 and n2 in the right term of the equation (2) vary depending on not only the angular deviation from the optical axis α and the angular deviation on the optical axis plane β but also the temperature T. Further, the setting angle Θ in the equation (1) is determined by the birefringence due to angular deviation and voltage application as described in the foregoing, thereby varying depending all on the angular deviation from the optical axis α, angular deviation on the optical axis plane β, amplitude V0 of the voltage Vm, and the temperature T. Accordingly, the Each of the Fourier coefficients ps1, ps1, ps2 . . . in the equation (4) is a function of the angular deviation from the optical axis α, the angular deviation on the optical axis plane β, the amplitude V0 of the voltage Vm, and the temperature T, and the equation (4) can be rewritten as below.

$$P = ps0(\alpha, \beta, V0, T) + ps1(\alpha, \beta, V0, T) \cdot \sin \omega t + ps2(\alpha, \beta, V0, T) \cdot \sin 2\omega t + \ldots \quad (5)$$

The optical voltage sensor measures a voltage by computing the modulation depth defined as a value indicating a ratio of AC component to DC component of output P outputted from the optical voltage sensor. Therefore, a sensitivity s of the optical voltage sensor for each beam strand is equal to the modulation depth m, and can be obtained by the following equation.

$$s = m = \frac{\sqrt{\sum_{k=1}^{\infty} \{p_{sk}(\alpha, \beta, V_0, T)\}^2}}{p_{s0}(\alpha, \beta, V_0, T)} \quad (6)$$

<0.2.2 Output for Beam>

Figure 3:
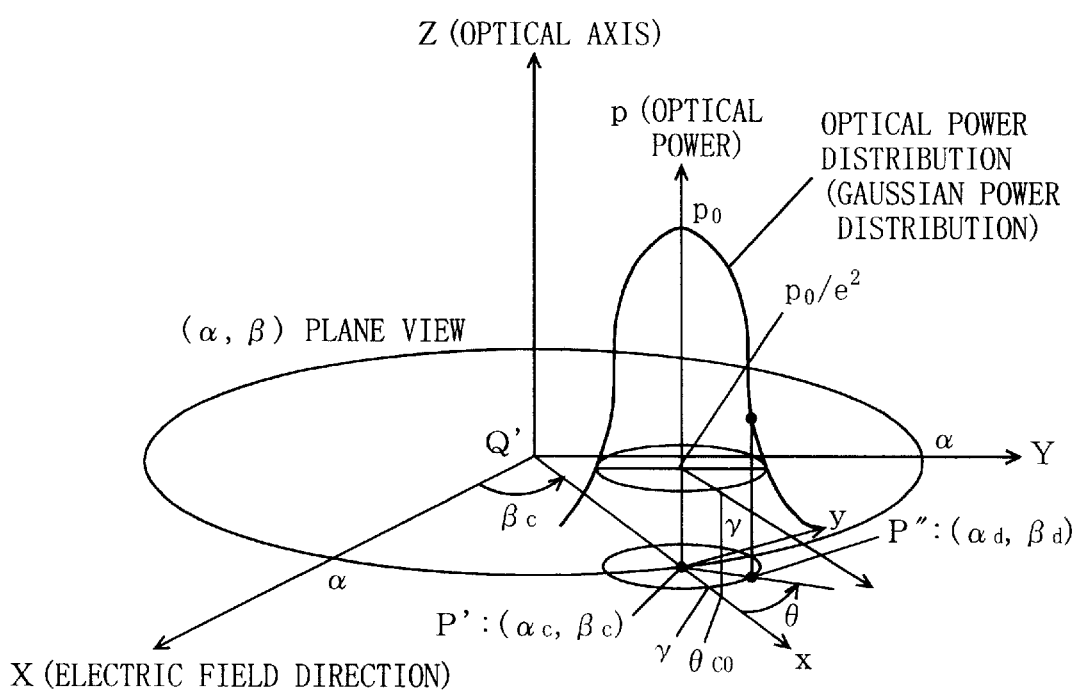
FIG. 3 is a diagram for explaining a beam model in an optical voltage sensor simulation.

As described in the foregoing, the beam used in the optical voltage sensor is a bundle of beam strands each denoted by such vector k as shown in FIG. 1, and an output from the optical voltage sensor is supposed to be an integral of outputs each for the beam strand structuring the beam. Further, in this simulation, the optical power of the beam shows Gaussian distribution. As shown in FIG. 3, the Gaussian distribution on an αβ plane is centered on a point (αc, βc) indicating the angular deviation from the optical axis αc and the angular deviation on the optical axis plane βc of the beam in the beam advancing direction (axis) (hereinafter, the direction is referred to as beam center direction (axis)).

Now take notice of one beam strand, and as to the target beam strand whose angle is angularly-deviated by γ with respect to the beam center axis angularly-deviated by αc from the optical axis and by θ with respect to the beam center axis angularly-deviated by βc on the optical axis plane, assuming that a standard deviation of the above Gaussian distribution is σ, the optical power of the target beam strand is $\exp(-\gamma^2/(2\sigma^2))$ times more than the optical power in the beam center direction ($\exp(-\gamma^2/(2\sigma^2))$ is irrelevant to θ, and surely is smaller than 1). Accordingly, each Fourier coefficient for the output from the optical voltage sensor with respect to the target beam strand is also $\exp(-\gamma^2/(2\sigma^2))$ times more than that for the output with respect to the beam strand in the beam center direction. That is, $$psk(\alpha d, \beta d, V0, T) = \exp(-\gamma^2/(2\sigma^2)) \cdot psk(\alpha c, \beta c, V0, T)(k=0, 1, 2, \ldots) \quad (7)$$

where the angular deviation from the optical axis and the angular deviation on the optical axis plane of the target beam strand are αd and βd, respectively. Accordingly, by integrating the above Fourier coefficient psk(αd, βd, V0, T) with respect to γ from 0 to ∞, and with respect to θ from 0 to 2π, a Fourier coefficient pk in Fourier expansion for the output P of the optical voltage sensor can be obtained. That is, $$p^k = \int_0^\infty \int_0^{2\pi} p_{sk}(\alpha_d, \beta_d, V_0, T) d\Theta d\gamma$$

$$= \int_0^\infty e^{-\frac{\gamma^2}{2\sigma^2}} \int_0^{2\pi} p_{sk}(\alpha_c, \beta_c, V_0, T) d\Theta d\gamma \quad (8)$$

As is known from the above equation (8), the Fourier coefficient pk is a function of the angular deviation from the optical axis αc and the angular deviation on the optical axis plane βc in the beam center direction, the amplitude V0 of the voltage Vm, the temperature T, and the standard deviation σ of the above Gaussian distribution. Herein, as shown in FIG. 3, the angular deviation γ with respect to the beam center axis is denoted by θco, optical power at which is $e^{-2}$ times of the optical power at the center of the Gaussian-distributed beam, and is referred to as "beam edge angle". The beam edge angle θco corresponds to a beam spot diameter, and θco=2σ. Therefore, the above Fourier coefficient pk is also a function of the beam edge angle θco, and can be expressed by pk(αc, βc, V0, T, θco).

As is known from the above, the sensitivity S (i.e., modulation depth M) of the optical voltage sensor is obtained by the following equation.

$$S = M = \frac{\sqrt{\sum_{k=1}^{\infty} \{p_k(\alpha_c, \beta_c, V_0, T, \Theta_\infty)\}^2}}{p_o(\alpha_c, \beta_c, V_0, T, \Theta_\infty)} \quad (9)$$

With the equation (9), it becomes possible to obtain the relationship between the sensitivity S of the optical voltage sensor and the parameters including the angular deviation from the optical axis αc and the angular deviation on the optical axis plane βc for the beam center axis of the beam coming into the electro-optic crystal 3, and the beam edge angle θco.

Figure 4:
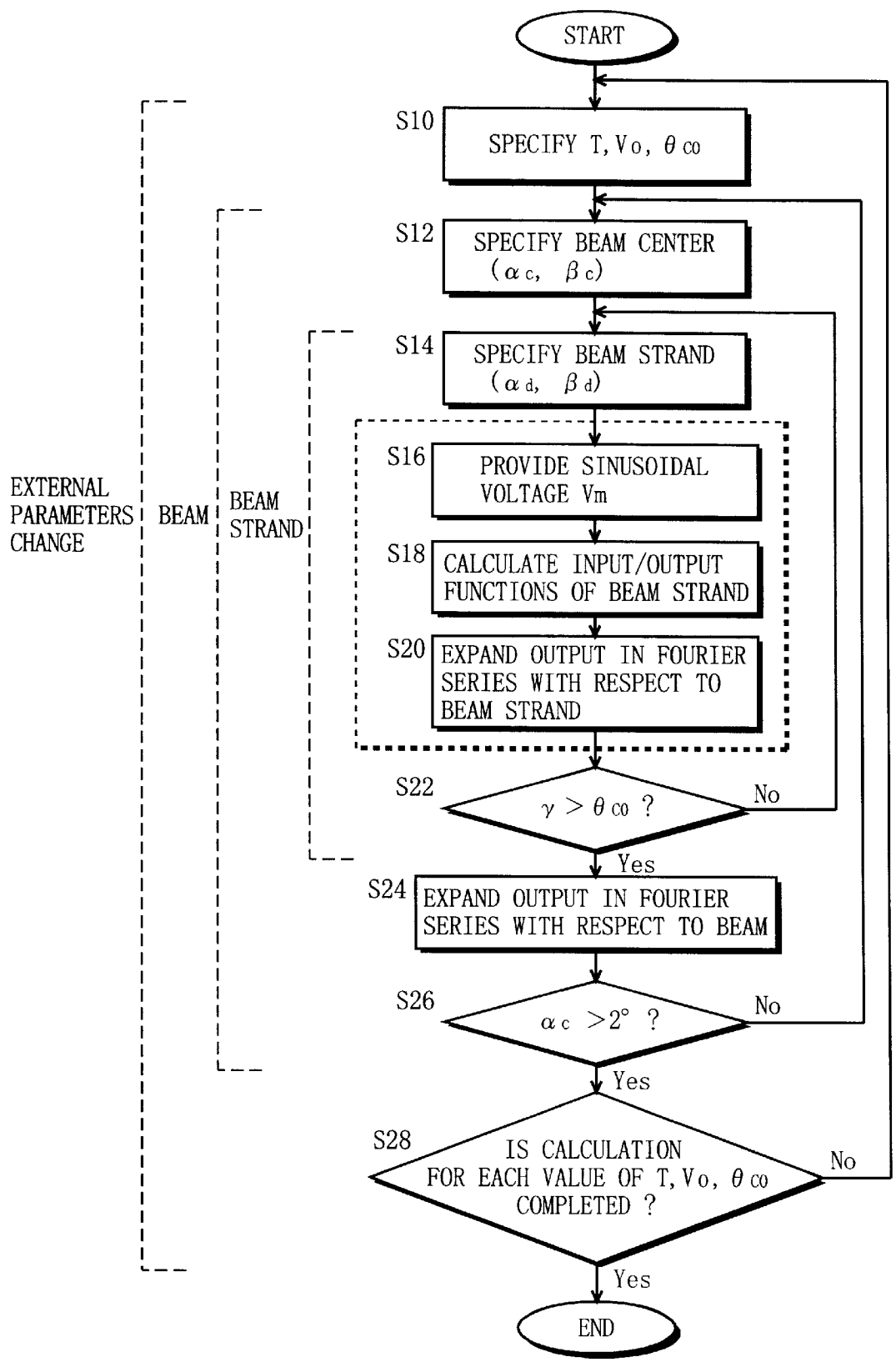
FIG. 4 is a flowchart showing the procedure for the optical voltage sensor simulation.

To be more specific, by utilizing the values of the parameters including the temperature T, the amplitude V0 of the voltage Vm, the angular deviation observed in the beam center direction (angular deviation from the optical axis αc and the angular deviation on the optical axis plane βc), and the beam edge angle θco, the sensitivity S of the optical voltage sensor is calculated, i.e, the optical voltage sensor simulation is done with the equation (9). FIG. 4 is a flowchart showing the procedure for the optical voltage sensor simulation. With reference thereto, the optical voltage sensor simulation will be described below.

In this simulation, the temperature T, the amplitude V0 of the voltage, and the beam edge angle θco are each first specified in value (step S10). Next, the angular deviation from the optical axis αc and the angular deviation on the optical axis plane βc both being the parameters indicating how the beam is angularly-deviated in the beam center direction are each specified in value (step S12). Then, one beam strand is selected from among those structuring the beam (step S14). This selection is done by specifying the angular deviation from the optical axis αd and the angular deviation on the optical axis plane βd for the beam strand. Hereinafter, the angular deviation of the beam strand is indicated by "(αd, βd)".

Thereafter, under conditions determined by these parameters each specified in value, the output from the optical voltage sensor is calculated in a computation simulation. That is, a sine wave input is provided to the electro-optic crystal 3 as the voltage Vm (Vm=V0·sin ωt) (step S16). Under such sine wave input provided as the voltage, the output from the optical voltage sensor with respect to the beam strand angularly-deviated by (αd, βd) is calculated (step S18). In this manner, input/output functions of the optical voltage sensor for the beam strand can be obtained. Thereafter, the output from the optical voltage sensor for the beam strand is expanded in the Fourier series so as to calculate the coefficients psk (k=0, 1, 2, . . . ) (step S20).

With the operation in steps S16, S18, and S20 carried out for each beam strand structuring the beam coming into the electro-optic crystal 3, the Fourier coefficient psk(αd, βd, V0, T, θco) is obtained for the output of each beam strand. By applying these Fourier coefficients to the equation (8), the Fourier coefficient pk can be obtained for the output from the optical voltage sensor with respect to the beam structured by beam strands (step S24). Herein, the Fourier coefficient psk(αd, βd, V0, T, θco) is integrated with respect to the angular deviation γ from 0 to ∞, and with respect to the angular deviation θ from 0 to 2π. Such integration with respect to γ and θ is carried out by summing the Psk. Note that the integration with respect to γ from 0 to ∞ is approximated through the summation from 0 to θco (step S22).

As such, with steps S14 to S22, the Fourier coefficient psk(αc, βc, V0, T) for the output from the optical voltage sensor is calculated for each beam strand angularly-deviated by (αd, βd) corresponding to the values of γ and θ which satisfy 0≦γ≦θco and 0≦θ≦2π. And in step S24, the Fourier coefficient pk(αc, βc, V0, T, θco) for the output from the optical voltage sensor is calculated as the total sum (integral) of the outputs for each beam strand.

In this simulation, in a similar manner to the above, the Fourier coefficient pk(αc, βc, V0, T, θco) for the output from the optical voltage sensor is calculated for any beam whose beam center axis is angularly-deviated by (αc, βc), where αc satisfies 0≦αc≦2[°] (steps S12 to S26). Further, in this simulation, such parameters as the temperature T, the amplitude V0 of the voltage, and the beam edge angle θco (external parameters) are varied in value so as to calculate the Fourier coefficient pk(αc, βc, V0, T, θco) each therefor (steps S10 to S28).

As such, the Fourier coefficient pk is obtained each for such parameters (αc, βc, V0, T, θco).

For each parameter used in the above-described optical voltage sensor simulation, the value range and the number thereof are both shown in FIG. 5. With the operation in steps S10 to S28, the Fourier coefficient pk each corresponding to the values of the parameters in FIG. 5 is obtained. By applying these Fourier coefficients pk to the equation (9), the sensitivity S of the optical voltage sensor is calculated, and thus the relationship between the sensitivity S and the angular deviation (αc, βc) in the beam center direction or the beam edge angle θco is obtained. Similarly, with the Fourier coefficients pk, the relationship between the sensitivity-temperature characteristic of the optical voltage sensor and the angular deviation (αc, βc) in the beam center direction or the beam edge angle θco can be obtained.

By referring to accompanying drawings, embodiments of the present invention are now described. Therein, the beam edge angle is focused as a parameter corresponding to the above-described beam edge angle θco, and is denoted by "$\theta_{CLN}$".

1. First Embodiment

First of all, an optical voltage sensor according to a first embodiment of the present invention is described.

The optical voltage sensor of the first embodiment is provided with, as shown in FIG. 1, the sensor part, the light emission part 10, and the light reception part 12. The sensor part has the polarizer 1, the λ/4 plate 2, the electro-optic crystal 3, and the analyzer 4 arranged in order of light incidence on an optical axis. The light emission part 10 includes a light source and an input side optical system, and a beam emitted from the light source goes to the sensor part via the input side optical system. In the sensor part, the polarizer 1, the λ/4 plate 2, the electro-optic crystal 3, and the analyzer 4 are arranged on an optical path of the beam. The beam is modulated by such optical components with the voltage Vm before output. The light reception part 12 includes an output side optical system and a photoelectric converter, and the beam outputted from the sensor part is received by the photoelectric converter through the output side optical system, and then is converted into an electrical signal.

In the optical voltage sensor of the first embodiment, as the electro-optic crystal 3 is used a z-axis-propagation LiNbO$_3$ crystal, and a Z axis (C axis) of the electro-optic crystal 3 is the optical axis. Further, the optical sensor of this embodiment is so designed that a center direction k of the beam coming into the electro-optic crystal 3 is appropriately set. Accordingly, the sensitivity (modulation depth) of the optical voltage sensor becomes a desired value or in a desired state. Herein, as shown in FIG. 1, the center direction k of the beam coming into the electro-optic crystal 3 can be expressed by the angular deviation from the optical axis $\alpha$ and the angular deviation on the optical axis plane $\beta$ both indicating how the beam is angularly-deviated with respect to the Z axis (optical axis). Therefore, in the first embodiment, by referring to the relationship between the sensitivity (modulation depth) of the optical voltage sensor and such parameters as the angular deviation from the optical axis $\alpha$ and the angular deviation on the optical axis plane $\beta$, (hereinafter, "sensitivity to angular deviation characteristics"), the angular deviation from the optical axis $\alpha$ and the angular deviation on the optical axis plane $\beta$ are so set that the sensitivity becomes desirable.

Figure 6:
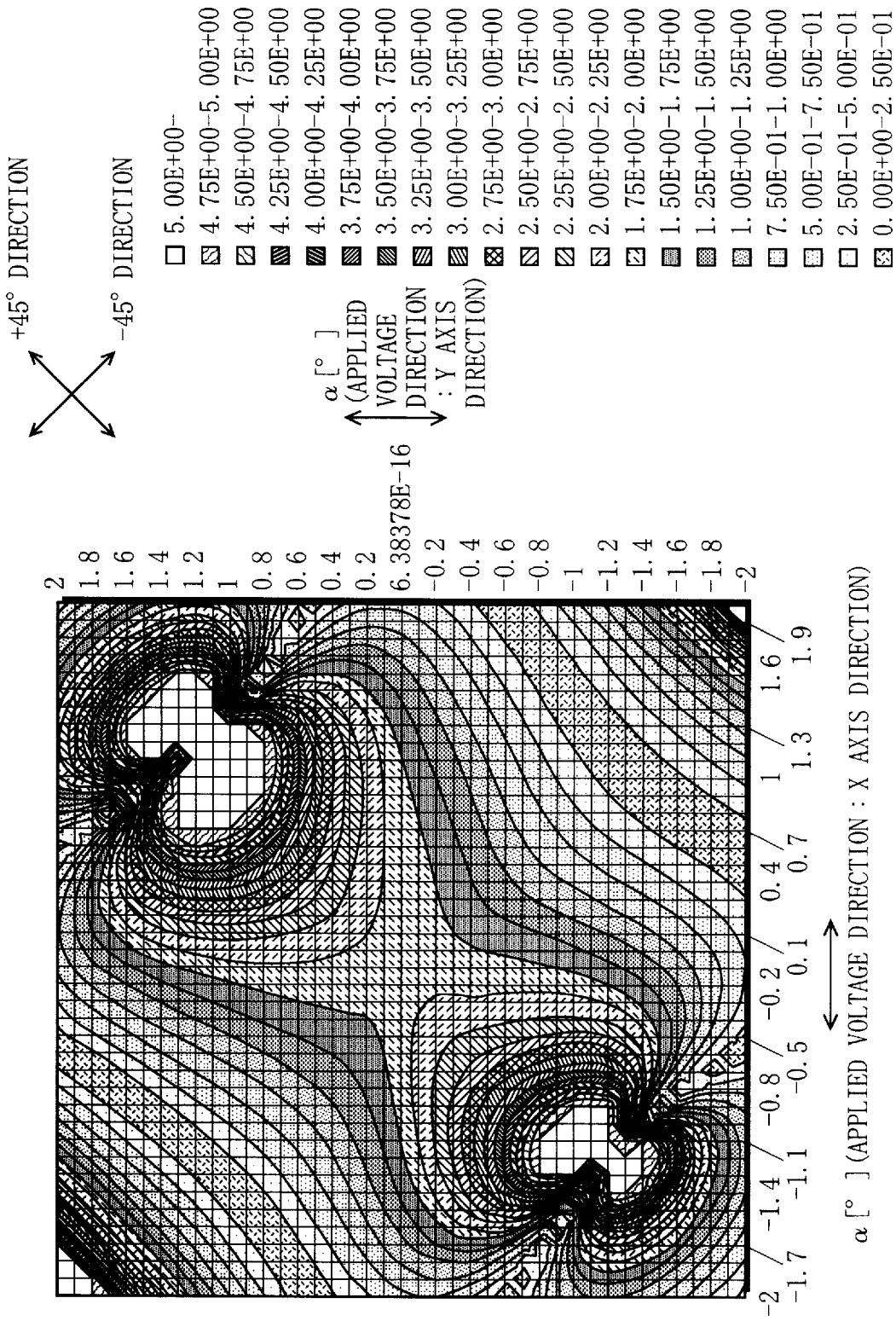
FIG. 6 is a contour plan characteristically showing a sensitivity to angular deviation characteristics of an optical voltage sensor according to a first embodiment of the present invention.

The sensitivity to angular deviation characteristics required for such setting is obtained in the optical voltage sensor simulation described in the foregoing. FIG. 6 is a contour plan showing the sensitivity to angular deviation characteristics obtained therein. The contour plan shows the angular deviation characteristics in terms of sensitivity (i.e., modulation depth) of the optical voltage sensor of this embodiment in a case where the beam coming into the electro-optic crystal 3 is a bundle of beam strands each showing no distribution in angle. Note that, in the optical voltage sensor simulation, the center wavelength of the light from the light source is 0.8 $\mu$m to 0.9 $\mu$m.

The contour plan in FIG. 6 shows curved contour lines indicating the sensitivity of the optical voltage sensor. The center of the plan corresponds to the optical axis of the electro-optic crystal 3, and a distance therefrom corresponds to the angular deviation from the optical axis $\alpha$. A direction viewed from the center of the plan corresponds to the angular deviation on the optical axis plane $\beta$. Accordingly, the contour plan in FIG. 6 positionally indicates how the beam coming into the electro-optic crystal 3 is angularly-deviated by ($\alpha$, $\beta$). Herein, a lateral axis in the contour plan indicates the angular deviation from the optical axis $\alpha$ in the direction of an electric field (X axis) while a longitudinal in the direction perpendicular to the electric field at the angular deviation from the optical axis $\alpha$ (Y axis).

As to the angular deviation characteristics shown in FIG. 6, that is, the sensitivity to angular deviation characteristics of the optical voltage sensor in the case that the beam coming into the electro-optic crystal is beam strand, the determination factor therefor is the index ellipsoid of the electro-optic crystal 3. Further, the angular deviation characteristics do not depend on the shape of the electro-optic crystal 3 but the sensitivity level does. As shown in FIG. 6, the sensitivity to angular deviation characteristics of the optical voltage sensor has a saddle point in the center of the contour area, $\alpha=0°$. In the direction of $\beta=45°$ ($\beta=225°$ included), the sensitivity may be increased as the angular deviation from the optical axis $\alpha$ increases. In the direction of $\beta=-45°$ ($\beta=135°$ included), on the other hand, the sensitivity may be decreased as the angular deviation from the optical axis $\alpha$ increases.

As is known from this, adjustment for the angular deviation of the beam coming into the electro-optic crystal 3, that is, adjustment for the angular deviation from the optical axis $\alpha$ and the angular deviation on the optical axis plane $\beta$, leads to adjustment for the sensitivity of the optical voltage sensor.

In order to implement the optical voltage sensor with the desired sensitivity, the parameters relevant to angular deviation are first determined in value with consideration for the relationship between the angular deviation ($\alpha$, $\beta$) of the beam coming into the electro-optic crystal 3 and the sensitivity of the optical voltage sensor (FIG. 6), that is, the sensitivity to angular deviation characteristics obtained in the optical voltage sensor simulation. Design specifications and parts' selection for the optical voltage sensor then follow so as to satisfy the values of the parameters.

In the foregoing, based on the sensitivity to angular deviation characteristics, the parameters are set in value so that the optical voltage sensor is with the desirable sensitivity. In addition to sensitivity, the angular deviation is inherently related also to optical power received by the light reception part, optical power to temperature characteristic, sensitivity-temperature characteristic, or sensitivity-voltage characteristic, whereby it is possible to adjust those through adjustment for the angular deviation ($\alpha$, $\beta$). For instance, the optical voltage sensor can be improved with sensitivity-temperature characteristic by setting the angular deviation from the optical axis $\alpha$ and the angular deviation on the optical axis plane $\beta$ in an appropriate range, respectively.

The above-described optical sensor disclosed in the Japanese Patent Laying-Open No. 7-248339 (95-248339) is also reduced in temperature dependence by adjusting the incident angle of the light coming into the Pockels element (electro-optic crystal). The incident angle corresponds to the angular deviation from the optical axis $\alpha$ in this embodiment. In the conventional optical sensor, however, the change in output caused by the change in the angular deviation on the optical axis plane $\beta$ is not acknowledged, and thus there is no mention of adjusting the angular deviation on the optical axis plane $\beta$. As is known from the above, adjusting the incident angle (angular deviation from the optical axis $\alpha$) is not enough to stabilize the temperature dependence. In this embodiment, on the other hand, with consideration also for the angular deviation on the optical axis plane $\beta$, the angular deviation ($\alpha$, $\beta$) is appropriately set, whereby the temperature dependence is successfully reduced. Further, unlike the conventional optical sensor, the angular deviation from the optical axis $\alpha$ and the angular deviation on the optical axis plane $\beta$ are set as design parameters. There is thus no need to include a mechanism for adjusting the angular deviation from the optical axis $\alpha$ as temperature changes.

2. Second Embodiment

An optical voltage sensor according to a second embodiment is now described.

The optical voltage sensor of the second embodiment is structurally the same as the one in the first embodiment. Any constituent appeared in the first embodiment is denoted by the same reference numeral, and is not described again.

Figure 7:
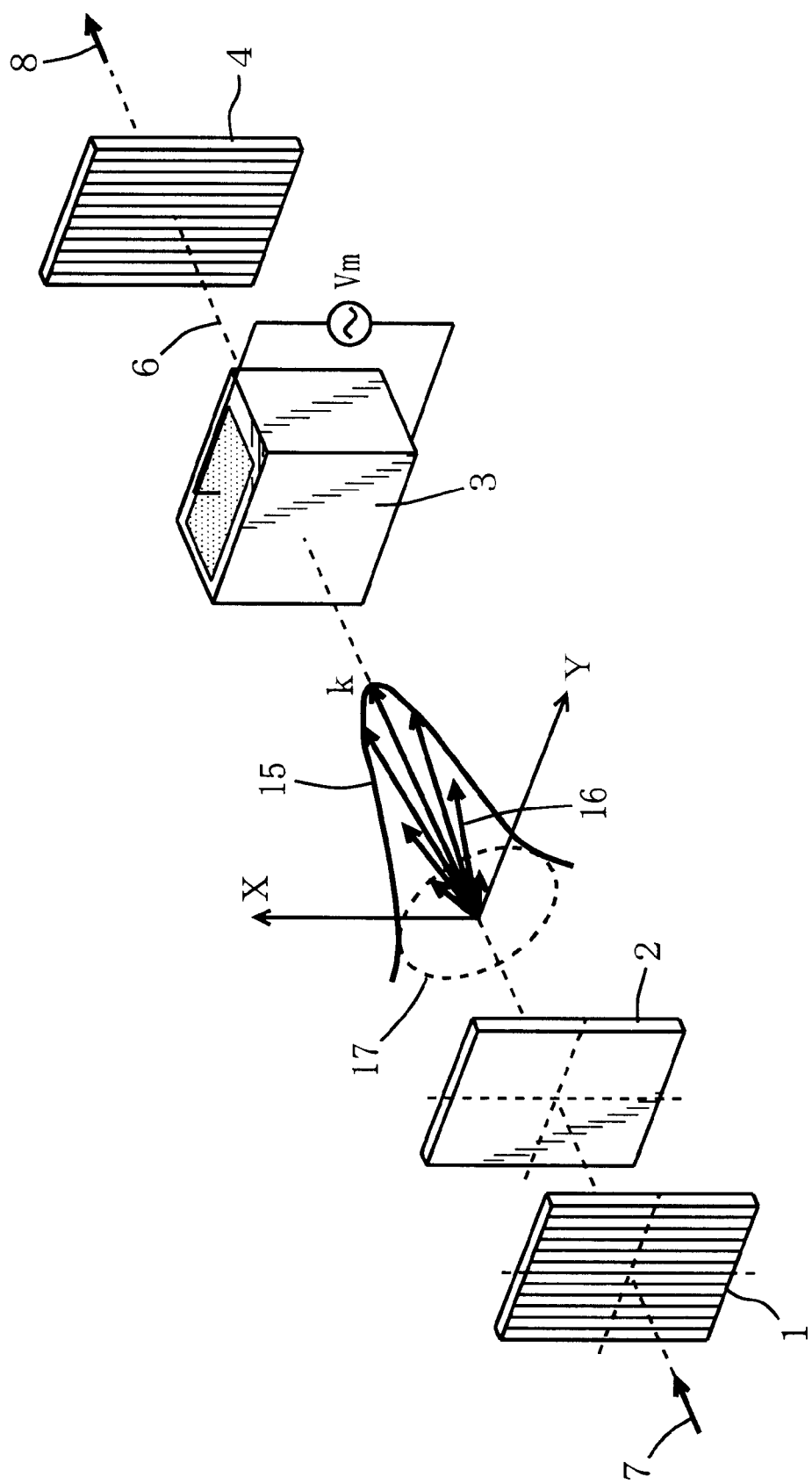
FIG. 7 is a diagram showing how a beam coming into an electro-optic crystal spreads in the optical voltage sensor.

As described above, the beam coming into the electro-optic crystal 3 is a bundle of beam strands 16 as shown in FIG. 7, and the strength of every beam strand is summed, and the summed value is regarded as the strength of the beam. Hence, if some beam strands in the beam are angularly-deviated and the beam show an angular distribution 15 in strength (optical power), the sensitivity of the optical voltage sensor is the sum of sensitivity proportionated for each beam strand according to the angular distribution 15. FIG. 6 shows that, as to the angular deviation on the optical axis plane β, an area where the sensitivity is decreased is larger than that where increased. Hence, when the angular deviation from the optical axis αc is 0° in the center direction of the beam coming into the electro-optic crystal 3, that is, when the beam has no angular deviation, the wider the beam spreads, thus the sensitivity is caused to decrease. Thus, it is also possible to adjust the sensitivity first by fixedly setting the angular deviation from the optical axis αc in the beam center direction to 0° so that the beam is freed from angular deviation in the direction, and then adjusting the beam edge angle of the beam.

Figure 8:
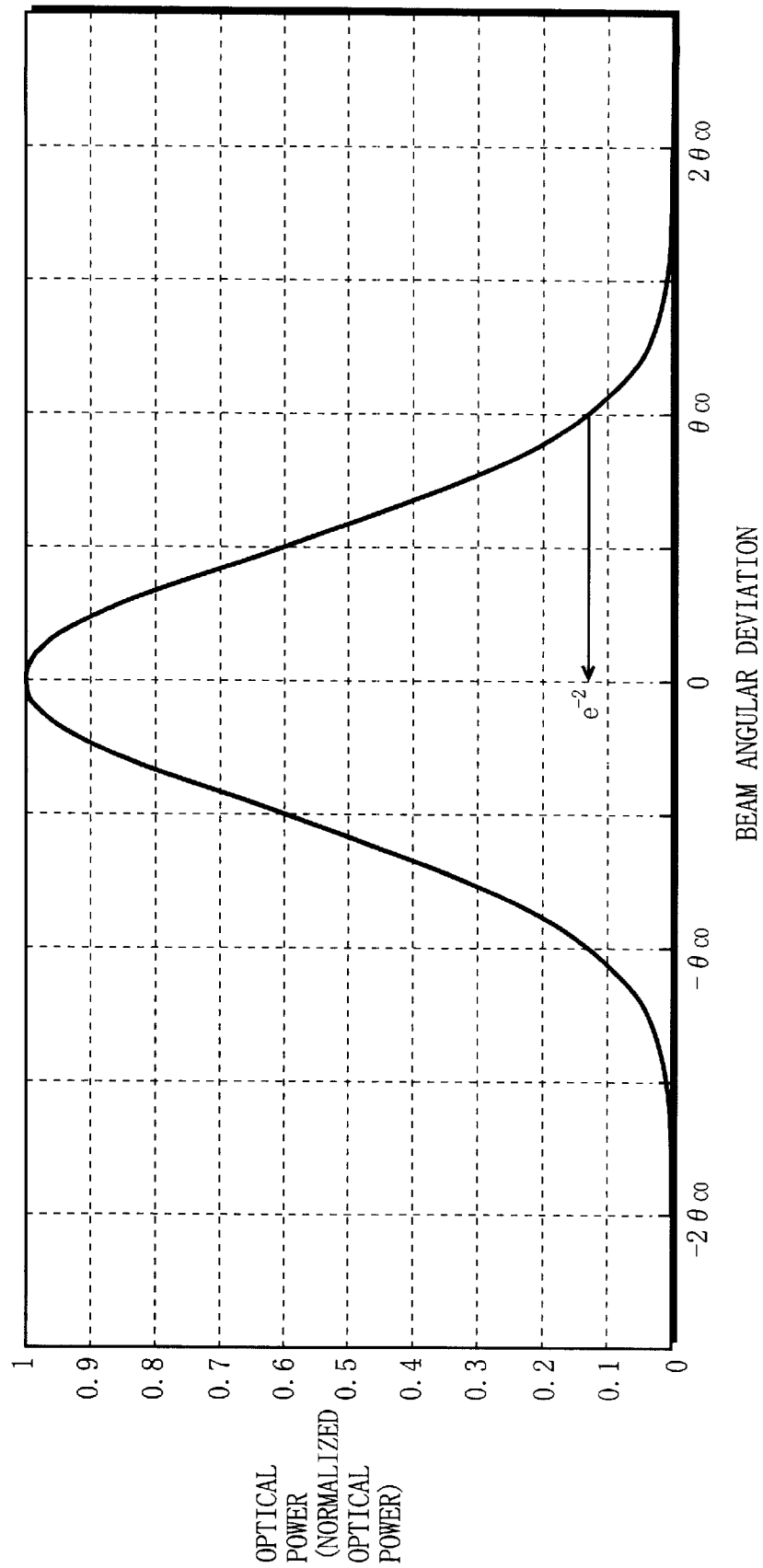
FIG. 8 is a graph showing an optical power distribution with respect to the angular deviation from the optical axis of the beam used in the optical voltage sensor.

The beam suffers from diffraction during propagation, and thus the optical power thereof shows the Gaussian distribution as to the angular deviation from the optical axis α as shown in FIG. 8. Therein, the angular deviation θco corresponding to the strength which is $e^{-2}$—times that at the beam center is the angle at a beam edge 17. Herein, in a beam shape measurement device, a position on a cross section of the beam where the strength which is $e^{-2}$—times that at the beam center is regarded as the beam edge so as to set a beam spot diameter. Accordingly, the beam edge corresponding to the beam edge angle θco is coincided with the beam edge on the beam spot diameter, whereby the beam edge angle of the beam can be specified by the beam edge.

In the case that the beam is not spreading but converging, the sensitivity of the optical voltage sensor can be adjusted in a similar manner to the above. This is because, from a viewpoint of angular deviation characteristics, the beam strands structuring the converging beam is equivalently angularly-deviated in angle to the beam strands structuring the spreading beam. FIG. 6 shows that, as to the angular deviation on the optical axis plane β, the area where the sensitivity is decreased is larger than that where increased. Therefore, the more the beam with no angular deviation (the angular deviation at the beam center α=0) is converged, the likelier the sensitivity may be decreased. As this is the same as with the spreading beam, the converging beam can be dealt in a similar manner thereto. This means that it is possible to adjust the sensitivity by adjusting the convergence angle of the beam. The description next below as to the beam edge angle is applicable to the beam which spreads or converges.

As described above, adjustment for sensitivity is possible first by fixedly setting the angular deviation from the optical axis αc in the center direction of the beam coming into the electro-optic crystal 3 to 0° so that the beam is freed from angular deviation in the direction, and then adjusting the beam edge angle of the beam. Therefore, to implement the optical voltage sensor with the desirable sensitivity, at the time of design thereof, the beam edge angle $\theta_{CLN}$ of the beam coming into the electro-optic crystal 3 is set to an appropriate value based on the relationship between the sensitivity of the optical voltage sensor and the angular deviation (α, β) of the beam coming into the electro-optic crystal 3 (see FIG. 6).

Alternatively, by utilizing the study as to the angular deviation characteristics that the angular deviation is inherently related not only to sensitivity but also to optical power, optical power to temperature characteristic, sensitivity-temperature characteristic, and sensitivity-voltage characteristic, it is also possible to adjust those in the optical voltage sensor by adjusting the beam edge angle $\theta_{CLN}$ of the beam coming into the electro-optic crystal 3. In the description next below, it is assumed that the beam edge angle $\theta_{CLN}$ is set based on the relationship between the beam edge angle $\theta_{CLN}$ and the sensitivity-temperature characteristic for the purpose of improving the sensitivity-temperature characteristic resulted from the temperature dependence of the λ/4 plate 2. Herein, a light source whose light has a center wavelength of 0.8 μm to 0.9 μm is used in the light emission part, and the λ/4 plate 2 is a crystal plate.

Figure 9:
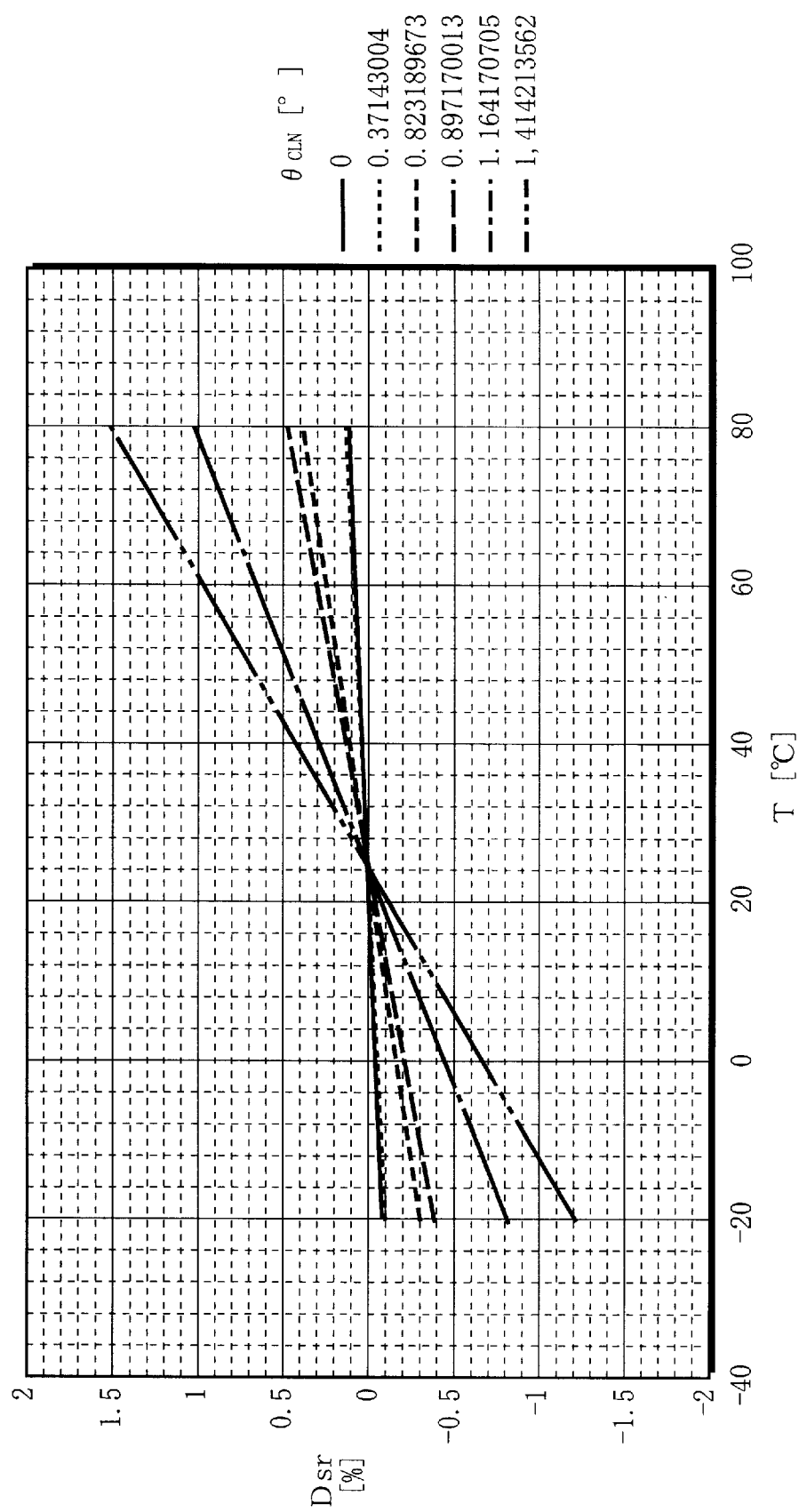
FIG. 9 is a graph characteristically showing, assuming that the beam has no angular deviation and the temperature dependence of a crystal $\lambda/4$ plate is disregarded, a sensitivity-temperature characteristic of the optical voltage sensor for various values of the beam edge angle $\theta_{CLN}$ of the beam coming into the electro-optic crystal.
Figure 10:
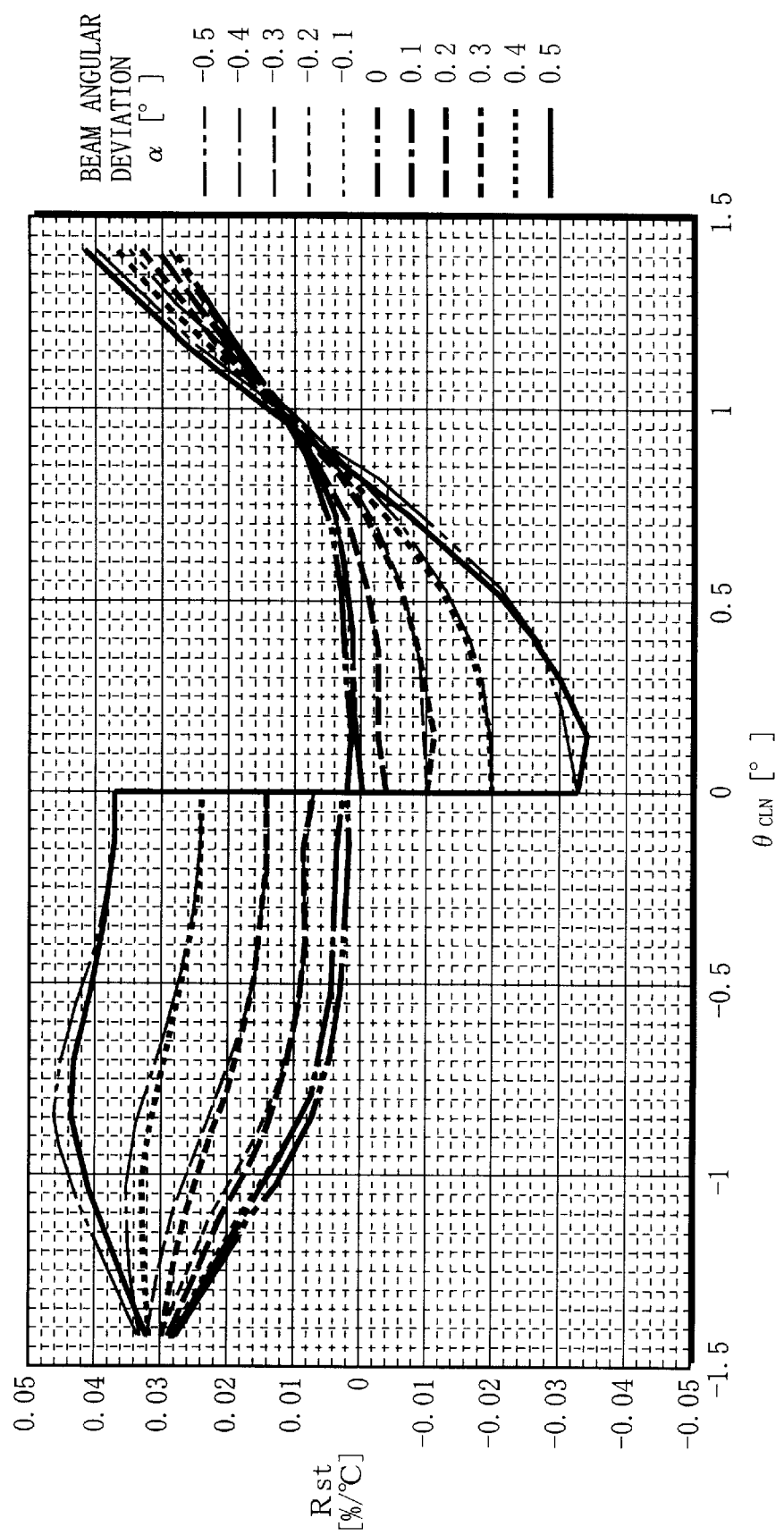
FIG. 10 is a graph characteristically showing the relationship, in the case that the temperature dependence of the crystal $\lambda/4$ plate 2 is disregarded, among the sensitivity-temperature ratio Rst, the angular deviation of the beam coming into the electro-optic crystal, and the beam edge angle $\theta_{CLN}$ of the beam.

Assuming that the beam has no angular deviation (the angular deviation from the optical axis α=0° at the beam center), and the temperature dependence of the λ/4 plate 2 is disregarded, the sensitivity-temperature characteristic of the optical voltage sensor is as shown in FIG. 9. To be specific, the characteristic theoretically varies linearly with temperature, and the characteristic linear line slants steeper as the beam edge angle $\theta_{CLN}$ of the beam increases. In FIG. 9, a lateral axis indicates temperature T, and a longitudinal axis indicates a difference in relative sensitivity from the one at 25° C. Such difference is hereinafter referred to as relative sensitivity difference Dsr. The relationship as shown in FIG. 9 is the one obtained in the above optical voltage sensor simulation. FIG. 10 is a graph showing the relationship, in the case that the temperature dependence of the λ/4 plate 2 is disregarded, among a sensitivity-temperature ratio Rst, the angular deviation (αc, βc) in the center direction of the beam coming into the electro-optic crystal 3, and the beam edge angle $\theta_{CLN}$ of the beam. Herein, the sensitivity-temperature ratio Rst is a ratio indicating how the relative sensitivity difference Dsr changes depending on temperature, that is, how the relative sensitivity difference Dsr changes per unit temperature. This relationship is obtained utilizing the study that the sensitivity-temperature characteristic of the optical voltage sensor is linear. Since the angular deviation is determined by the angular deviation from the optical axis α and the angular deviation on the optical axis plane β, and the angular deviation characteristics with respect to the sensitivity-temperature characteristic is symmetrical, the sensitivity-temperature characteristic becomes maximum or minimum in the direction of β=±45°, 135°, and 225° with respect to the respective angular deviations α. Accordingly, to determine the angular deviation (α, β) where the sensitivity-temperature characteristic is maximum or minimum, only the directions of β=±45°, 135°, and 225° matter. FIG. 10 shows these four directions by combination of signs of the beam edge angle $\theta_{CLN}$ and the angular deviation from the optical axis αc. In detail, the beam edge angle $\theta_{CLN}$ and the angular deviation from the optical axis αc are bracketed, in order, and expressed by + sign and − sign, respectively, as "(± for $\theta_{CLN}$, ± for αc)". Accordingly, (+, +) corresponds to β=45°, (+, −) to β=225°, (−, +) to β=−45°, and (−, −) to β=135°.

As shown in FIG. 10, when the angular deviation on the optical axis plane βc in the center direction of the beam coming into the electro-optic crystal 3 is +45° (i.e., when the beam edge angle $\theta_{CLN}$ is +), the sensitivity-temperature ratio Rst is changed from negative (a rate of sensitivity change shows negative correlation to temperature) to positive (the rate of sensitivity change shows positive correlation to temperature) as the beam spreads wider. On the other hand, when the angular deviation on the optical axis plane βc is −45° (i.e., when the beam edge angle $\theta_{CLN}$ is −) the sensitivity-temperature ratio Rst remains positive and increases as the beam spreads wider. Note that, |αc|<0.5°.

Figure 11:
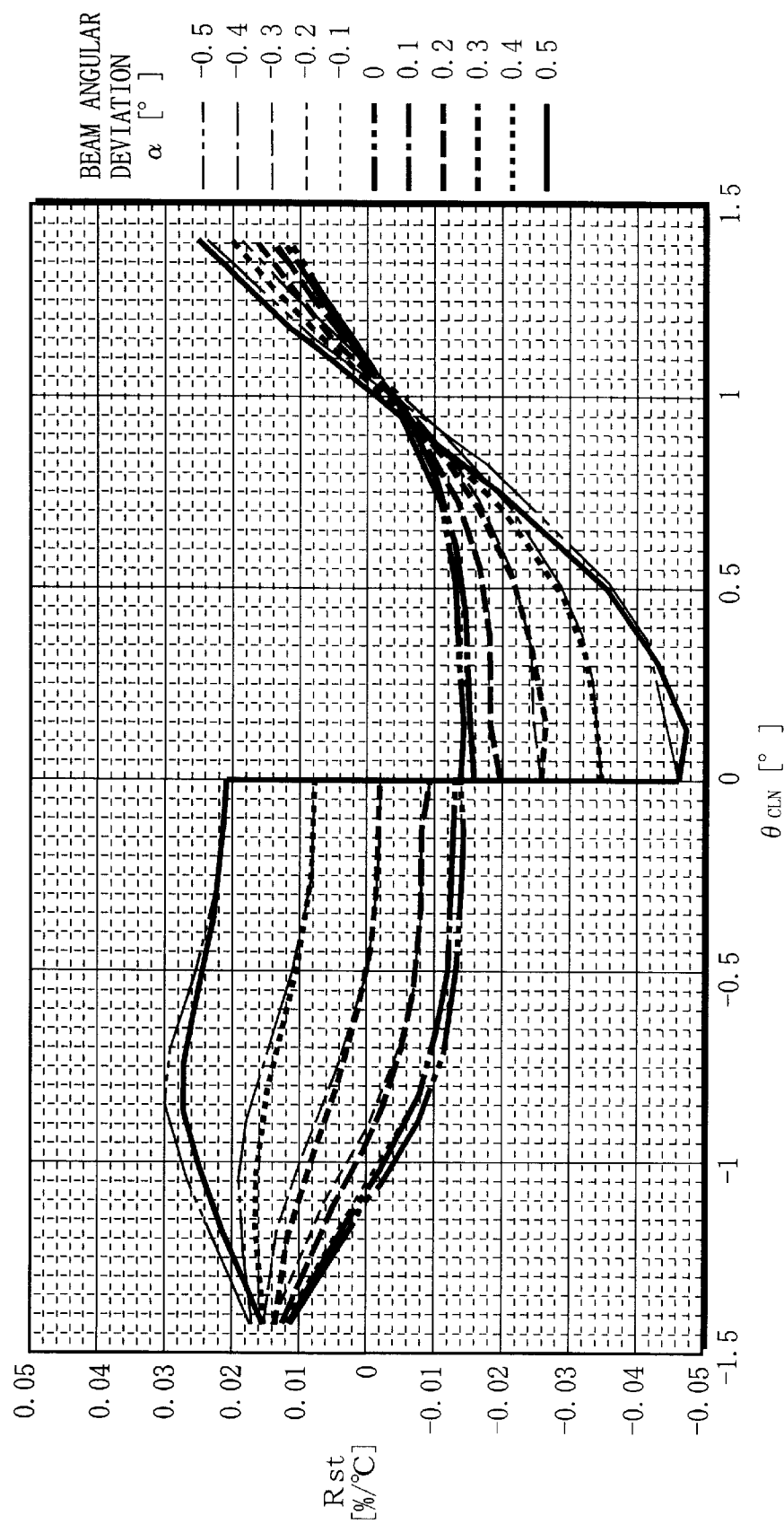
FIG. 11 is a graph characteristically showing the relationship, in the case that the temperature dependence of the crystal $\lambda/4$ plate 2 is considered, among the sensitivity-temperature ratio Rst, the angular deviation of the beam coming into the electro-optic crystal, and the beam edge angle $\theta_{CLN}$ of the beam.

FIG. 11 is a graph showing the relationship among the angular deviation (αc, βc) in the center direction of the beam coming into the electro-optic crystal 3, the beam edge angle $\theta_{CLN}$, and the sensitivity-temperature ratio Rst with consideration for the temperature dependence of the crystal λ/4 plate 2. According to FIG. 11, when the angular deviation on the optical axis plane β in the beam center direction is +45° (when the beam edge angle $\theta_{CLN}$ is +), the beam with the sensitivity-temperature ratio Rst about 0[%/° C.] is mostly observed in $\theta_{CLN}$=1.1° vicinity regardless of the angular deviation from the optical axis αc. On the other hand, when the angular deviation on the optical axis plane βc is −45° (when the beam edge angle $\theta_{CLN}$ is −), the beam with the sensitivity-temperature ratio Rst about 0[%/° C.] is observed in $\theta_{CLN}$=1.0° vicinity when |αc|<0.3° but not when |αc|≧0.3°. As is known from this, by using any beam whose beam edge angle $\theta_{CLN}$ is in a range of 0.8° to 1.4°, the sensitivity-temperature ratio Rst may possibly be about not more than +0.02[%/° C.] and not less than −0.02[%/° C.] (variation is within about 0.04[%/° C.]), that is, −0.02≦Rst≦0.02, no matter how the beam is angularly-deviated in the center direction. In such case as −0.02≦Rst≦0.02, variation of sensitivity with temperature is about not less than −1[%] and not more than 1[%] (variation is within about 2[%]) in an operating temperature range of −20° C. to 80° C. Further, when the beam with no angular deviation in the center direction (αc=0°) is used, by setting the beam edge angle $\theta_{CLN}$ thereof to the range of 0.8° to 1.4°, the sensitivity-temperature ratio Rst may possibly be about not less than −0.01[%] and not more than 0.01[%] (variation is within about 0.02%), that is, −0.01≦Rst≦0.01. In such case as −0.01≦Rst≦0.01, variation of sensitivity with temperature is about not less than −0.5[%] and not more than 0.5[%] in the operating temperature range of −20° C. to 80° C.

In order to implement the optical voltage sensor of the second embodiment, design specifications and parts' selection are made so that the beam edge angle $\theta_{CLN}$ of the beam is in the range of 0.8 to 1.4°. This is done by referring to the relationship between the sensitivity-temperature ratio Rst and the angular deviation characteristics shown in FIG. 11, that is, the status ($\theta_{CLN}$, αc, βc) of the beam coming into the electro-optic crystal 3. In this manner, the temperature dependence of the optical voltage sensor is reduced, and variation of sensitivity with temperature is about not less than −1[%] and not more than 1[%] (variation is within about 2[%]) in the operating temperature range of −20° C. to 80° C. Especially when the angular deviation from the optical axis αc in the center direction of the beam coming into the electro-optic crystal 3 is set to 0°, variation of sensitivity with temperature will be about not less than −0.5[%] and not more than 0.5[%] (variation is within about 1[%]) in the operating temperature range of −20° C. to 80° C.

3. Third Embodiment

An optical voltage sensor according to a third embodiment of the present invention is now described.

The optical voltage sensor of the third embodiment includes, like the one in the first embodiment shown in FIG. 1, the sensor part, the light emission part 10, and the light reception part 12. The sensor part has the polarizer 1, the λ/4 plate 2, the Z-axis propagation LiNbO₃ crystal as the electro-optic crystal 3, and the analyzer 4 arranged in order of light incidence on an optical axis. Any constituent appeared in the first embodiment is denoted by the same reference numeral.

Figure 21:
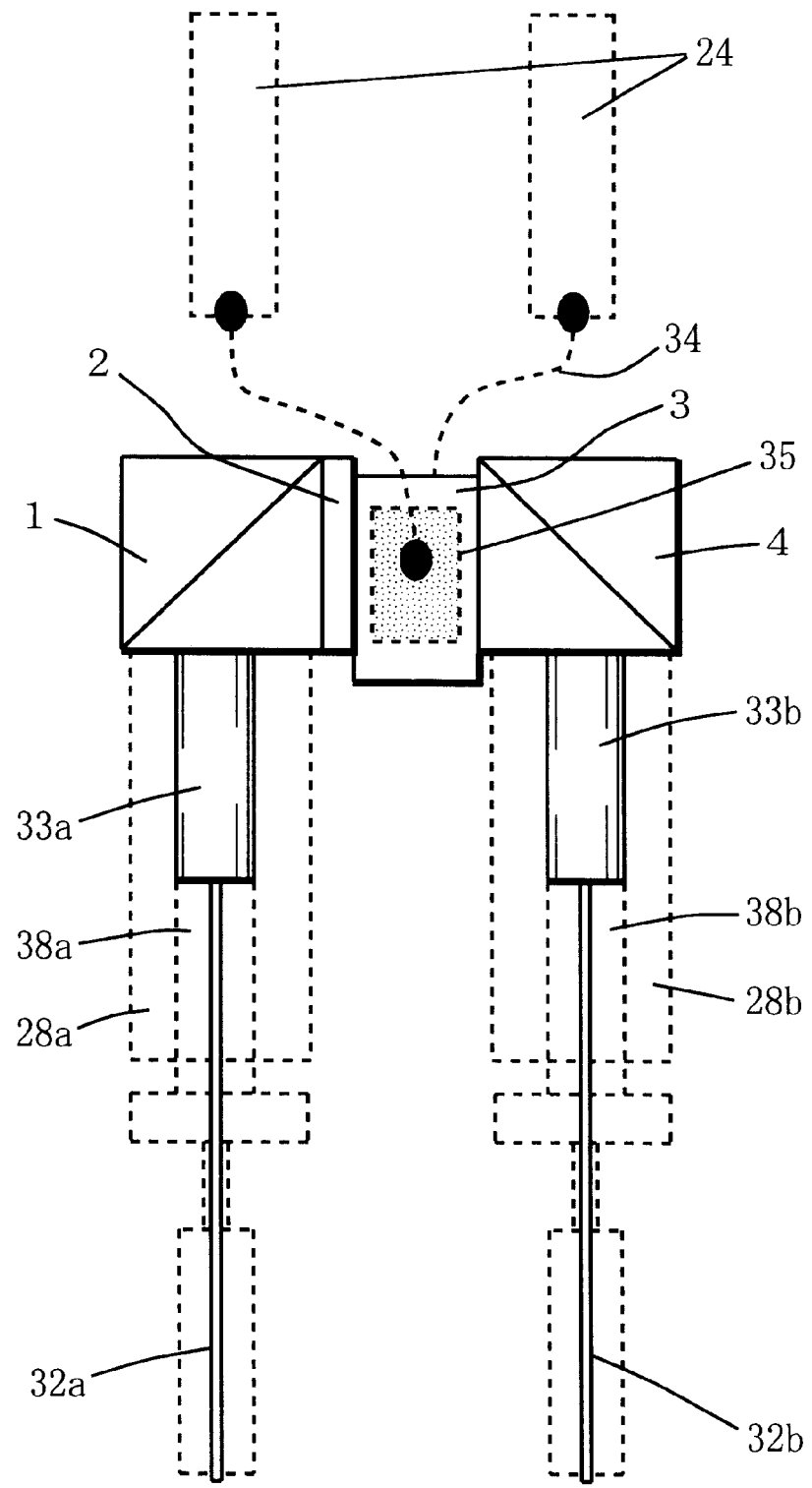
FIG. 21 is a perspective front view showing a conventional optical voltage sensor simplified in structure.
Figure 22:
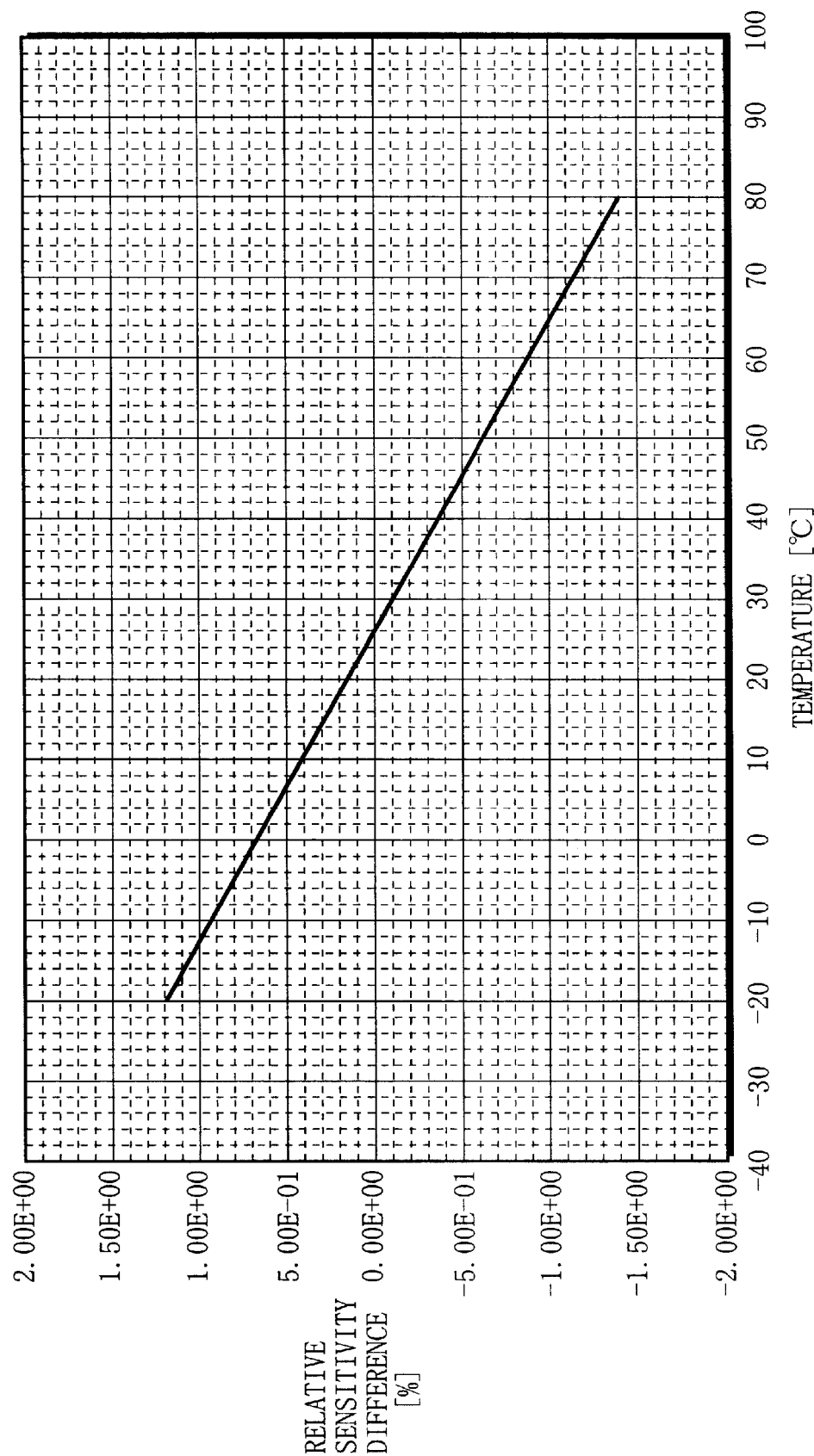
FIG. 22 is a graph how a λ/4 plate in the conventional optical voltage sensor affects the temperature dependence thereof.

The optical voltage sensor of this embodiment is structurally the same as the conventional optical voltage sensor shown in FIG. 21. The light emission part 10 includes the E/O circuit including the light source, and the input side optical system having the optical fiber 32a, the ferrule 38a, the GRIN lens 33a, and the holder 28a arranged on an optical axis. As to these optical components in the input side optical system, optical axis planes adjacent to each other are bonded by an optically transparent adhesive. The light reception part 12 is structured by the output side optical system in the same manner as with the input side optical system, and the O/E circuit including the converting element which converts a beam emitted from the output side optical system into an electrical signal.

Figure 12:
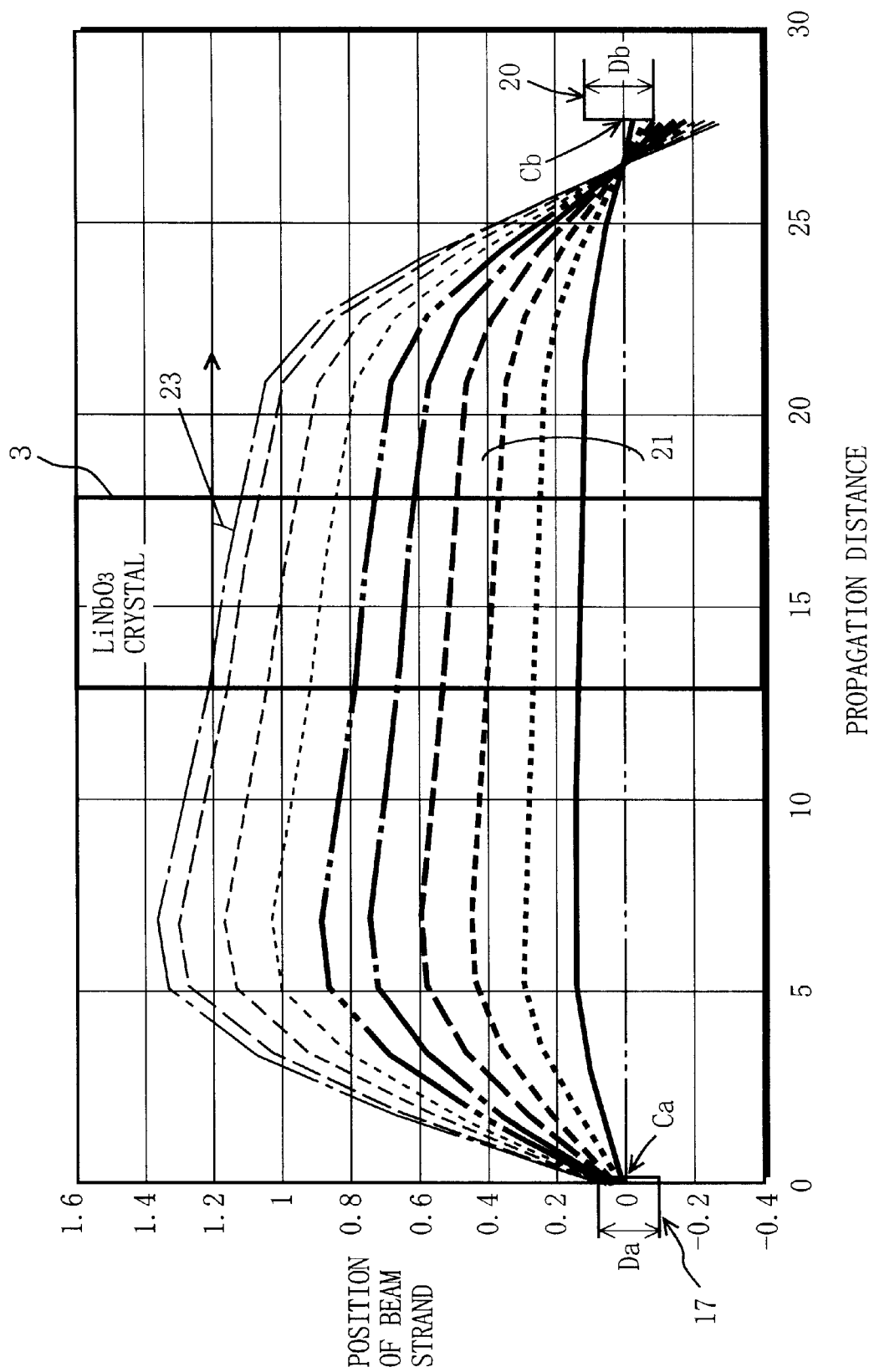
FIG. 12 is a diagram showing a ray trace of typical beam strands structuring the beam having no angular deviation in the optical voltage sensor of a third embodiment.

FIG. 12 shows a ray trace in the optical voltage sensor of the third embodiment. The ray therein is the beam strand typically included in the beam supposedly having no angular deviation (the angular deviation at the beam center α=0°). Among the beam strands structuring the beam emitted from the optical fiber 32a in the light emission part 10, any beam strand differed in emission position on a core face 19 of the optical fiber 32a is thus differently angularly-deviated on the electro-optic crystal 3 through the lens 33a.

Needless to say, the longer the distance between the emission position for the beam strand 16 and a center Ca on the core face 19, the larger an incident angle 23 of the beam strand reached the electro-optic crystal 3 becomes. Consequently, according to the distance, a position where the beam strand 16 reaches the optical fiber 32b in the light reception part 12 is away from a center Cb of a core face 20 of the optical fiber 32b. Herein, any beam strand not coming through the core face 20 having a diameter Db is not received. Further, any beam strand 16 not satisfying an angle for reception determined by NA (Numerical Aperture) of the optical fiber 32b is not received. Since the optical voltage sensor is characteristically determined only by the characteristic of the successfully-received beam strand(s) 21, the diameter Db of the core 20 and the NA of the optical fiber 32b are the factors for the characteristics of the optical voltage sensor.

Although FIG. 12 shows the beam strands only for the half of the cross section of the beam including the optical axis, the beam without angular deviation actually shows symmetry with respect to the optical axis. Further, the lens 33b itself is adjustable according to light reception conditions such as diameter or NA thereof, whereby, as an alternative manner to the above, the optical voltage sensor can be changed in characteristics. Still further, similarly in the case that the beam is angularly-deviated, the optical voltage sensor can be changed in characteristics by selectively receiving the beam strands 16.

The optical voltage sensor of the third embodiment has such structure that not every beam from the optical fiber 32a and the GRIN lens 33a to the GRIN lens 33b or the optical fiber 32b is received. The reception of the beams is controlled by the light reception conditions (i.e., the diameter or NA of the lens 33b, the core diameter Db or NA of the optical fiber 32b) for the GRIN lens 33b or the optical fiber 32b, and thus the beams are selectively received. Such light reception conditions are appropriately set so as to make the optical voltage sensor characteristically desirable.

For instance, in the first embodiment, the angular deviation (α, β) of the beam coming into the electro-optic crystal 3 is set to be appropriate to improve the sensitivity-temperature characteristic. In the third embodiment, instead, the light reception part is accordingly set with the light reception conditions so as to receive only the beam strands appropriately angularly-deviated. Further, in the second embodiment, the beam edge angle $\theta_{CLN}$ of the beam coming into the electro-optic crystal 3 is appropriately set (specifically, between 0.8 to 1.4°) to improve the sensitivity-temperature characteristic. In the third embodiment, instead, the light reception part may be set with the light reception conditions so as to receive only the beam strands whose beam edge angle $\theta_{CLN}$ is in the above range. The light reception conditions include one or more of the core diameter Db and NA of the optical fiber 32b, and the diameter and NA of the lens 33b.

4. Fourth Embodiment

An optical voltage sensor according to a fourth embodiment of the present invention is now described.

The optical voltage sensor of the fourth embodiment is simplified in structure similarly to the one in the third embodiment shown in FIGS. 21 and 1, and any constituent appeared in the third embodiment is denoted by the same reference numeral. In the third embodiment, the light reception part is set to selectively receive the beams to provide the optical voltage sensor with a desired level of sensitivity. In the fourth embodiment, instead, a core diameter Da of the optical fiber 32a in the light emission part 10 is appropriately set to have the desired level of sensitivity. Herein, the light emission part 10 has a light source from which the light has a center wavelength of 0.8 to 0.9 μm, the lenses 33a and 33b are a GRIN lens with 0.25 pitch for wavelength of the light, the electro-optic crystal 3 is the LiNbO$_3$ crystal, and the λ/4 plate 2 is a crystal plate. If such GRIN lens is not available, a GRIN lens with 0.25 pitch for the wavelength in the vicinity of the light from the light source, that is, a GRIN lens with a 0.25 pitch for the wavelength may be a replacement. For example, when the light from the light source in use has a central wavelength of 0.85 μm, a GRIN lens with a 0.25 pitch for a wavelength of 0.83 μm may be a possibility.

Figure 13:
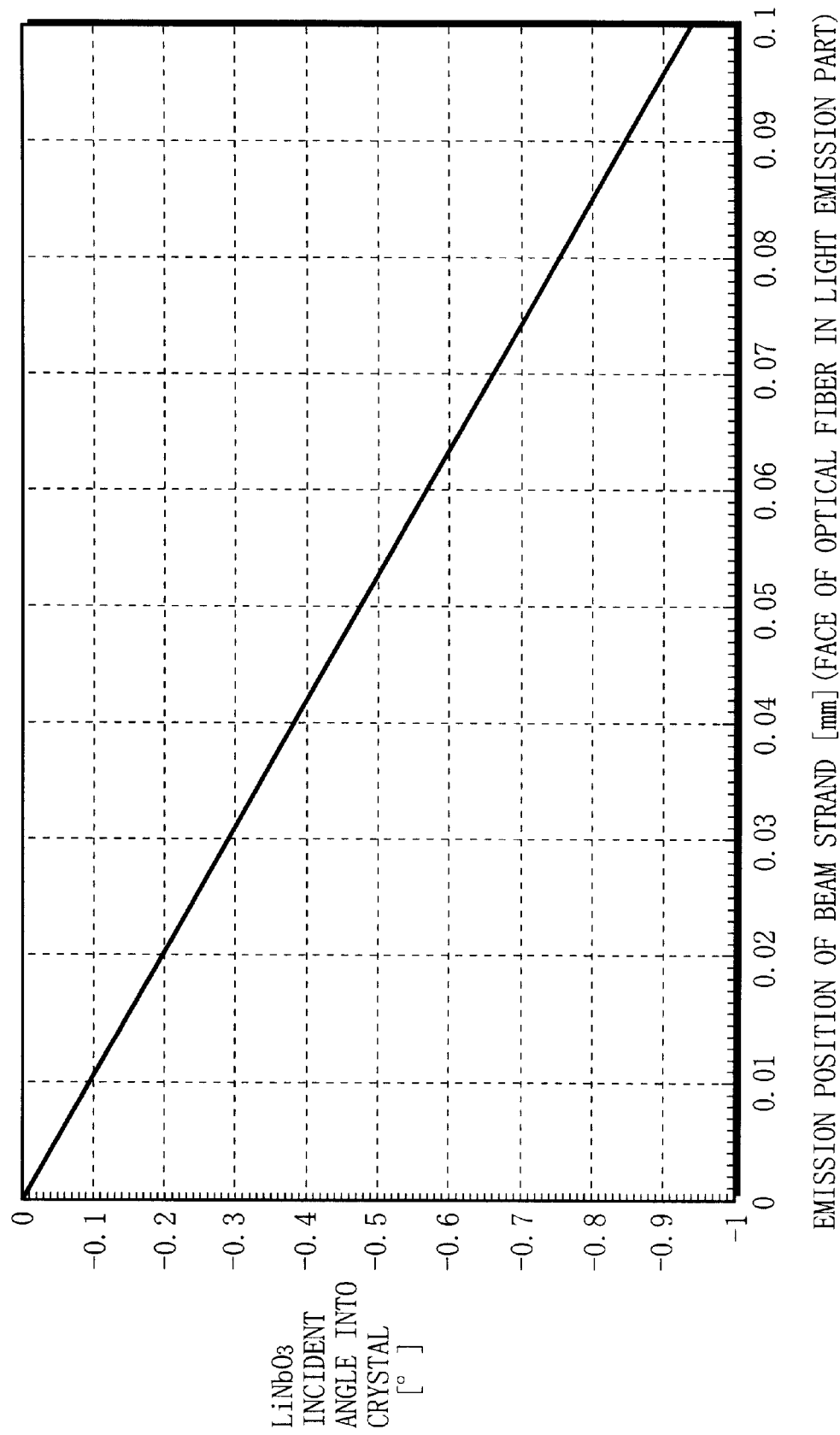
FIG. 13 is a graph showing the relationship between an emission position of the beam strand on a face of the optical fiber in the light emission part and an incident angle of the beam strand on the electro-optic crystal according to a fifth embodiment.

FIG. 13 is a graph showing the relationship between the emission position of the beam strand on a face of the optical fiber 32a and the incident angle 23 of the beam strand on the electro-optic crystal 3. The main determination factor for such relationship is the GRIN lens 33a. The relationship shown in FIG. 13 is obtained under a ray-tracing method, and the GRIN lens used therefor is a S20S25XXXX GRIN lens available from the Nippon Sheet Glass Co., Ltd. Based on such relationship, in the fourth embodiment, the core diameter Da of the optical fiber 32a is selectively determined so that the optical voltage sensor is with a desired level of sensitivity-temperature characteristic. Note that, the graph in FIG. 13 covers only a range between 0 to 0.1 mm for the distance between the emission position and the center Ca of the core face 19. Any distance not covered therein can be found only by extrapolating the linear line in the graph.

As described in the second embodiment (see FIG. 11), by using any beam whose beam edge angle $\theta_{CLN}$ is in a range of 0.8 to 1.4°, no matter how the beam is angularly-deviated in the center direction, variation of sensitivity with temperature is about not less than −1[%] and not more than 1[%] (variation is within about 2[%]) in the operating temperature range of −20° C. to 80° C. When the beam with no angular deviation in the center direction (αc=0°) is used, by setting the beam edge angle $\theta_{CLN}$ thereof to the range of 0.8 to 1.4°, variation of sensitivity with temperature is about not less than −0.5[%] and not more than 0.5[%] in the operating temperature range of −20° C. to 80° C.

In the fourth embodiment, the core diameter Da of the optical fiber 32a corresponding to the range for the beam edge angle $\theta_{CLN}$ of 0.8 to 1.4° is determined based on the linear line (and extrapolated part thereof) shown in FIG. 13. To be more specific, as to a possible emission position on the face of the optical fiber 32a for the beam strand whose incident angle 23 is in the range of 0.8 to 1.4°, a region which covers the distance from the center Ca of the core face 19 being in the range of 0.08 to 0.14[mm] is selected. Thereafter, the core diameter Da of the optical fiber 32a is determined based on the selected region (see FIG. 12). As such, with consideration for the characteristic of the GRIN lens 33a, the optimal core diameter Da is determined as in a range of 0.16 to 0.28[mm]. The optical fiber 32a used in this embodiment satisfies such range for its core diameter Da.

According to the fourth embodiment, since the optical fiber 32a in the light emission part 10 satisfies the range of 0.16 to 0.28[mm] for its core diameter Da, the beam edge angle $\theta_{CLN}$ of the beam coming into the electro-optic crystal 3 accordingly satisfies the range of 0.8 to 1.4°. As a result, variation of sensitivity with temperature is about not less than −1[%] and not more than 1[%] (variation is within about 2[%]) in the operating temperature range of −20° C. to 80° C. Especially when the angular deviation from the optical axis αc at the center of the beam coming into the electro-optic crystal 3 is set to 0° (no angular deviation), variation of sensitivity with temperature is about not less than −0.5[%] and not more than 0.5[%] in the operating temperature range of −20° C. to 80° C.

5. Fifth Embodiment

An optical voltage sensor according to a fifth embodiment of the present invention is now described.

The optical voltage sensor of the fifth embodiment is structurally the same as the one in the third embodiment shown in FIGS. 21 and 1, and any constituent appeared in the third embodiment is denoted by the same reference numeral. The optical voltage sensor of this embodiment has such structure that a center axis of the core 19 of the optical fiber 32a is displaced from the optical axis so that the light reception part 12 is stabilized with its optical power to be received. Herein, the electro-optic crystal 3 is the Z-axis propagation LiNbO$_3$ crystal, and the λ/4 plate 2 is a crystal plate. The fast axis of the λ/4 plate 2 having the birefringence property is set to 45° with respect to the X axis (direction of the electric field in the electro-optic crystal 3). Further, the polarizer 1 and the analyzer 4 are so arranged that the poralizing direction thereof are parallel to each other.

Figure 14:
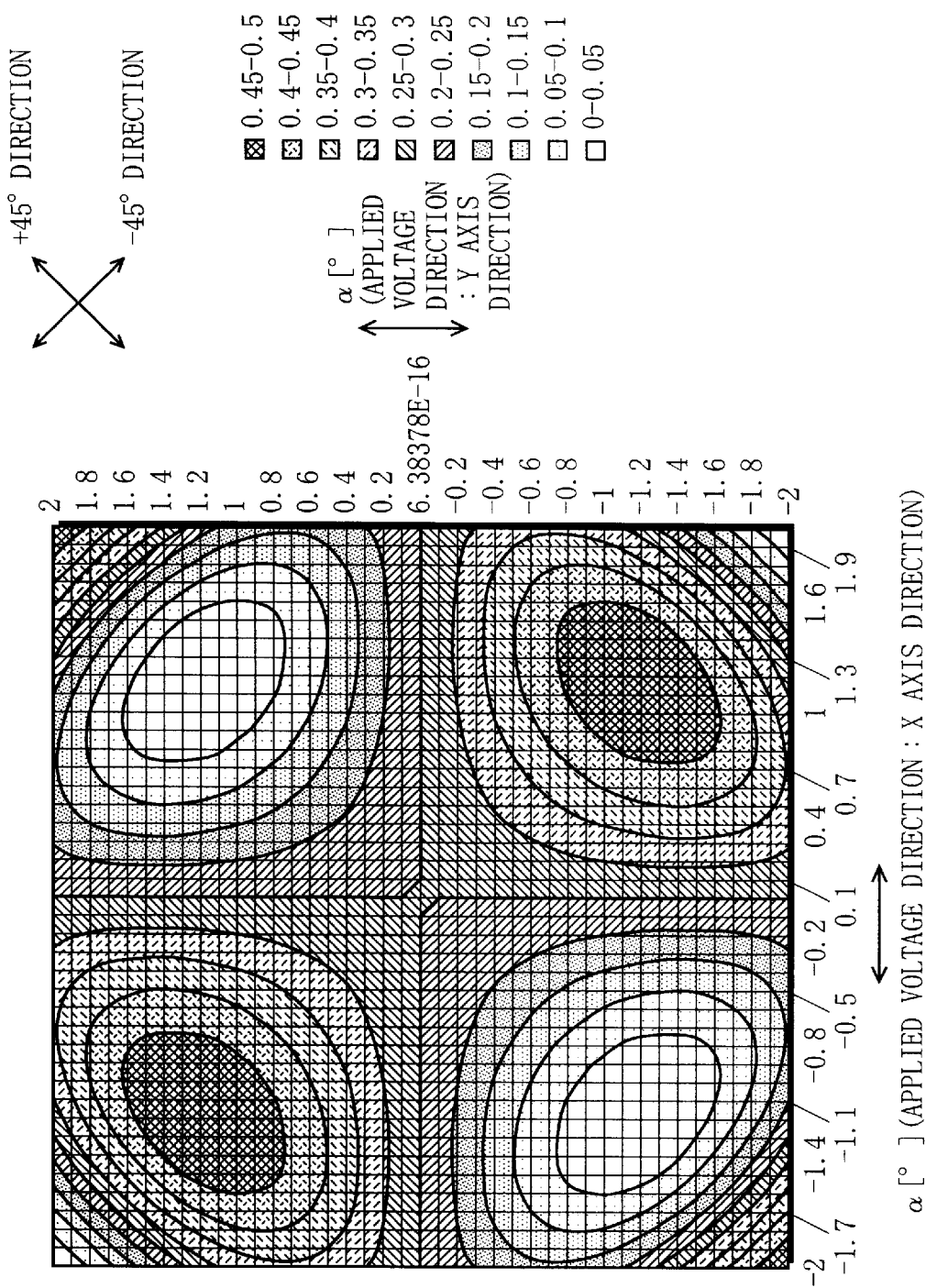
FIG. 14 is a contour plan showing the angular deviation characteristics of the DC output from the optical voltage sensor in the fifth embodiment.

FIG. 14 is a contour plan showing the angular deviation characteristics of the DC output from the optical voltage sensor in this embodiment, that is, a contour plan showing the relationship between the angular deviation (α, β) of the beam coming into the electro-optic crystal LiNbO$_3$ 3 and the DC output from the optical voltage sensor. The relationship in the contour plan is obtained in the above-described optical voltage sensor simulation. The contour plan in FIG. 14 shows contour lines indicating the DC output from the optical voltage sensor. The center of the plan is equivalent to the optical axis of the electro-optic crystal 3, and a distance therefrom corresponds to the angular deviation from the optical axis α. A direction viewed from the center of the plan corresponds to the angular deviation on the optical axis plane β.

In FIG. 14, the angular deviation from the optical axis a where the DC output from the optical voltage sensor is minimum is observed in the direction of β=+45°, and the angular deviation from the optical axis α where the DC output is maximum is observed in the direction of β=−45°.

As is known from FIG. 12, the beam strands varied in emission position on the face of the core face 19 of the optical fiber 32a show each different incident angle 23 (=α) on the electro-optic crystal 3. Accordingly, the DC output from the optical voltage sensor becomes minimum at a certain point in the course of displacing the center axis of the core 19 in the direction of β=+45° parallel to the optical axis, and similarly, becomes maximum in the direction of β=−45°. It means that the DC output from the optical voltage sensor varies to the greatest degree when the center axis of the core 19 is displaced in the directions of β=±45°. Therefore, variation of the DC output in the directions of β=±45° tells how the DC output may change when the center axis is displaced in some other directions.

Figure 15:
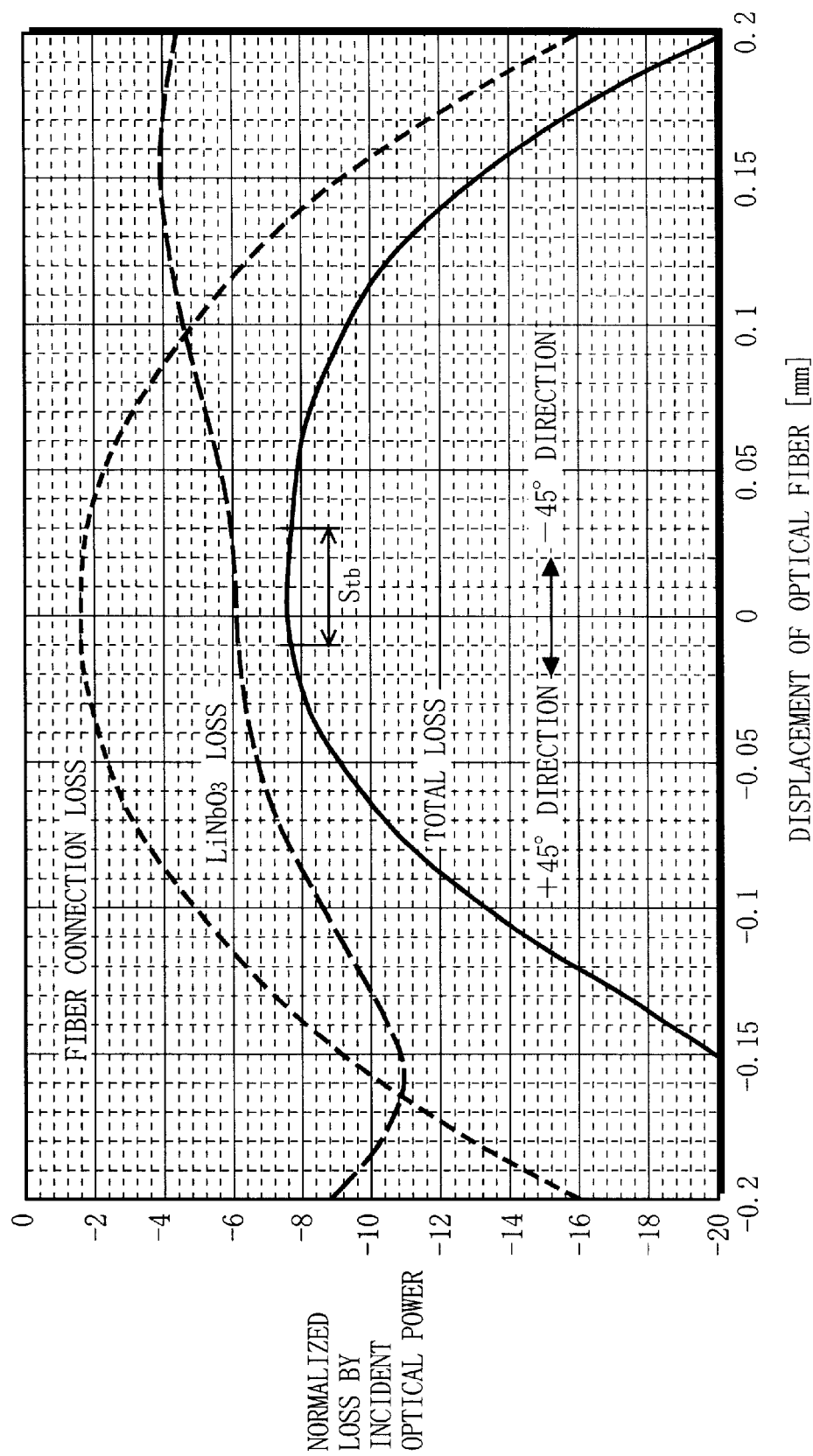
FIG. 15 is a diagram characteristically showing the relationship between an axial displaced position of an optical fiber in the direction of ±45° and the optical power to be received by the light reception part.

FIG. 15 is a diagram characteristically showing the relationship (hereinafter, "fiber to displacement characteristics") between the displacement of the center axis of the core 19 of the optical fiber 32a and the optical power to be received by the light reception part 12 when the center axis is displaced in the direction of β=+45° parallel to the optical axis. A "LiNbO$_3$ loss" characteristic curve (dashed line) in FIG. 15 is on the presumption that every beam emitted from the light emission part 10 is received by the light reception part 12. This curve shows the angular deviation characteristics of the DC output in FIG. 14 from the directional perspective of β=±45°. In FIG. 15, the displacement of the center axis of the core 19 in the direction of β=−45° is indicated by the + sign, and by the − sign in the direction of β=+45°.

As described above, the "LiNbO$_3$ loss" characteristic curve is on the presumption that every beam from the light emission part 10 is received by the light reception part 12. However, if the optical fiber 32b of the light reception part 12 is fixed on the optical axis, not every beam from the light emission part 10 can be received. In detail, if the optical fiber 32b is fixedly placed on the optical axis in the course of displacing the center axis of the core 19 in the directions of β=±45° parallel to the optical axis, the optical power to be received by the light reception part 12 is decreased according to a "fiber connection loss" characteristic curve (dotted line) in FIG. 15.

The fiber to displacement characteristics with consideration also for the "fiber connection loss" characteristic curve can be comprehensively indicated as a "total loss" characteristic curve (solid line) in FIG. 15. Specifically, the relationship between the displacement of the center axis of the core 19 of the optical fiber 32a and the optical power to be received by the optical fiber 32b in the case that the center axis is displaced in the directions of β=±45° parallel to the optical axis is, as the "total loss" characteristic curve shown in FIG. 15, indicated by an attenuation curve asymmetrical to the optical axis.

If no LiNbO$_3$ loss is observed, the optical power to be received is stabilized and is minimized in variation resulted from the parts' tolerances, or the like, when the center axis of the core 19 coincides with the optical axis. If the LiNbO$_3$ loss is observed, an optical power stabilizing region Stb is observed in the direction of β=−45° with respect to the optical axis. This optical power stabilizing region Stb is resulted from cancel-out between the "fiber connection loss" characteristic curve and the "LiNbO$_3$ loss" characteristic curve in terms of optical power. Such optical power stabilizing region is observed also in some other directions, but is smaller in size. This is because, as shown in FIG. 14, the DC output from the optical voltage sensor shows less change if the center axis of the core 19 is displaced in the direction other than β=−45°.

As is known from the above, the optical power stabilizing region Stb becomes the largest in the direction of β=−45° among all (hereinafter, the displacement direction in which the region Stb becomes the largest is referred to as "optical power stabilizing direction"). According to the "total loss" characteristic curve in FIG. 15, the light reception is stabilized in optical power and thus is minimized in variation due to the parts' tolerances, or the like, when the center axis of the core 19 is displaced by about 0.01[mm]. As is known from FIG. 15, the displacement of the center axis which can make the light reception maximized in optical power in the optical power stabilizing direction may be regarded as displacement which can make the variation of optical power minimized.

A determination factors for the optical power stabilizing direction is how a setting angle difference between the polarizer and the analyzer is related to a difference in the fast axis direction between the λ/4 plate 2 and the electro-optic crystal 3. And determination factors for the optimal displacement of the center axis, i.e., the displacement which can make the variation in optical power resulted from the parts' tolerances minimized (hereinafter, "optical power stabilizing displacement"), include the core diameter and NA of the optical fiber, and the types of the electro-optic crystal 3. The light stabilizing direction is obtained as below.

(1) When the polarizer and analyzer are parallel to each other in polarizing direction.

In the course of displacing, parallel to the optical axis, the center axis of the core 19 of the optical fiber 32a in the direction in which the fast axis of the λ/4 plate 2 having the birefringence property and the fast axis of the electro-optic crystal 3 having the birefringence property are perpendicular to each other, the variation in optical power resulted from the parts' tolerances is minimized at a certain position. Herein, the LiNbO$_3$ crystal used as the electro-optic crystal 3 is a negative uniaxial crystal. Therefore, if the center axis of the core 19 is displaced in the direction perpendicular to the fast axis of the λ/4 plate 2, the fast axis of the λ/4 plate 2 and the fast axis of the electro-optic crystal 3 becomes perpendicular to each other. In this manner, the direction perpendicular to the fast axis of the λ/4 plate 2 is the optical power stabilizing direction.

(2) When the polarizer and analyzer are perpendicular to each other in polarizing direction.

In the course of displacing, parallel to the optical axis, the center axis of the core 19 of the optical fiber 32a in the direction in which the fast axis of the λ/4 plate 2 having the birefringence property and the fast axis of the electro-optic crystal 3 having the birefringence property are parallel to each other, the variation in optical power resulted from the parts' tolerances is minimized at a certain position. Herein, the LiNbO$_3$ crystal used as the electro-optic crystal 3 is a negative uniaxial crystal. Therefore, if the center axis of the core 19 is displaced in the direction parallel to the fast axis of the λ/4 plate 2, the fast axis of the λ/4 plate 2 and the fast axis of the electro-optic crystal 3 becomes parallel to each other. In this manner, the direction parallel to the fast axis of the λ/4 plate 2 is the optical power stabilizing direction.

As already described, in the fifth embodiment, the fast axis of the λ/4 plate 2 is set to 45° with respect to the X axis (direction of the electric field in the electro-optic crystal 3), and the polarizer 1 and the analyzer 4 are so arranged that the poralizing directions thereof are parallel to each other. In the optical voltage sensor of this embodiment, based on (1), the center axis of the core 19 is displaced, parallel to the optical axis, in the direction of 45° so that the fast axis on the reference plane of the LiNbO$_3$ crystal (electro-optic crystal 3) is set to the direction of −45° (approx.) with respect to the X axis. The resultant displacement of the center axis is 0.01[mm] from the optical axis in the direction of −45° as shown in FIG. 15 by the "total loss" characteristic curve. The displacement of the center axis can be set by adjusting optical axes between the optical fiber 32a and the GRIN lens 33a with the mechanical accuracy of the holder 28a and the ferrule 38a as in a later-described seventh embodiment.

According to the fifth embodiment, the center axis of the core of the optical fiber 32a in the light emission part is so set as to be located at or in the vicinity of the optical power stabilizing position in the optical power stabilizing direction. In this manner, the optical power received in the light reception part is stabilized, and thus the variation in optical power resulted from parts' tolerances is nearly minimized.

6. Sixth Embodiment

An optical voltage sensor according to a sixth embodiment of the present invention is described next below.

The optical voltage of the sixth embodiment is structurally the same as the one in the third and fifth embodiments shown in FIGS. 21 and 1, and any constituent appeared in the third and fifth embodiments is denoted by the same reference numeral. Herein, like the one in the fifth embodiment, the electro-optic crystal 3 is the Z-axis propagation LiNbO$_3$ crystal, and the λ/4 plate 2 is a crystal plate. The fast axis of the λ/4 plate 2 having the birefringence property is set to 45° with respect to the X axis, and the polarizer 1 and the analyzer 4 are so arranged that the poralizing directions thereof are parallel to each other.

In the fifth embodiment, the center axis of the core 19 of the optical fiber 32a in the light emission part 10 is set displaced with respect to the optical axis so that the variation in optical power resulted from the parts' tolerances is reduced as much as possible. In the sixth embodiment, instead, the center axis to be displaced with respect to the optical axis is of the core 20 of the optical fiber 32b in the light reception part 12. Accordingly, the light reception part 12 is controlled to selectively receive incoming beams, whereby the optical power is stabilized, and the variation in optical power resulted from the parts' tolerances is thus reduced as much as possible.

As described above, in the sixth embodiment, the fast axis of the λ/4 plate 2 is set to 45° with respect to the X axis, and the polarizer 1 and the analyzer 4 are so arranged that the poralizing directions thereof are parallel to each other. In the optical voltage sensor of this embodiment, based on (1), the center axis of the core 20 is displaced, parallel to the optical axis, in the direction of −45° so that the fast axis on the reference plane of the LiNbO$_3$ crystal (electro-optic crystal 3) is set to the direction of −45° (approx.) with respect to the X axis. The displacement of the center axis of the core 20 can be set by adjusting the optical axes between the optical fiber 32b and the GRIN lens 33b with the mechanical accuracy of the holder 28b and the ferrule 38b as in the later-described seventh embodiment.

In the case that the center axis of the core 19 of the optical fiber 32a is set coincided with the optical axis but not the center axis of the core 20 of the optical fiber 32b, the "total loss" characteristic curve in FIG. 15 shows no change for the relationship between the displacement of the center axis of the core 20 and the optical power of the received light at the optical fiber 32b. Note that, no matter which center axis of the core 19 or 20 is displaced, the relationship between the direction of the displacement of the center axis and the optical power (DC output) remains the same, but not the relationship between the displacement thereof and the optical power (DC output) due to the angular distribution of the beam. Herein, as is known from FIG. 15, the displacement of the center axis where the optical power is maximized in the optical power stabilizing direction is regarded as displacement which can make the variation of optical power minimized.

According to the sixth embodiment, the optical voltage sensor is so structured that the center axis of the core 19 of the optical fiber 32a in the light emission part 10 is coincided with the optical axis, and the center axis of the core 20 of the optical fiber 32b in the light reception part 12 is displaced from the optical axis as described above. Therefore, as in the fifth embodiment, the optical power to be received is stabilized, and thus the variation of the optical power resulted from the parts' tolerances is minimized.

7. Seventh Embodiment

An optical voltage sensor according to the seventh embodiment of the present invention is described next below.

Figure 16:
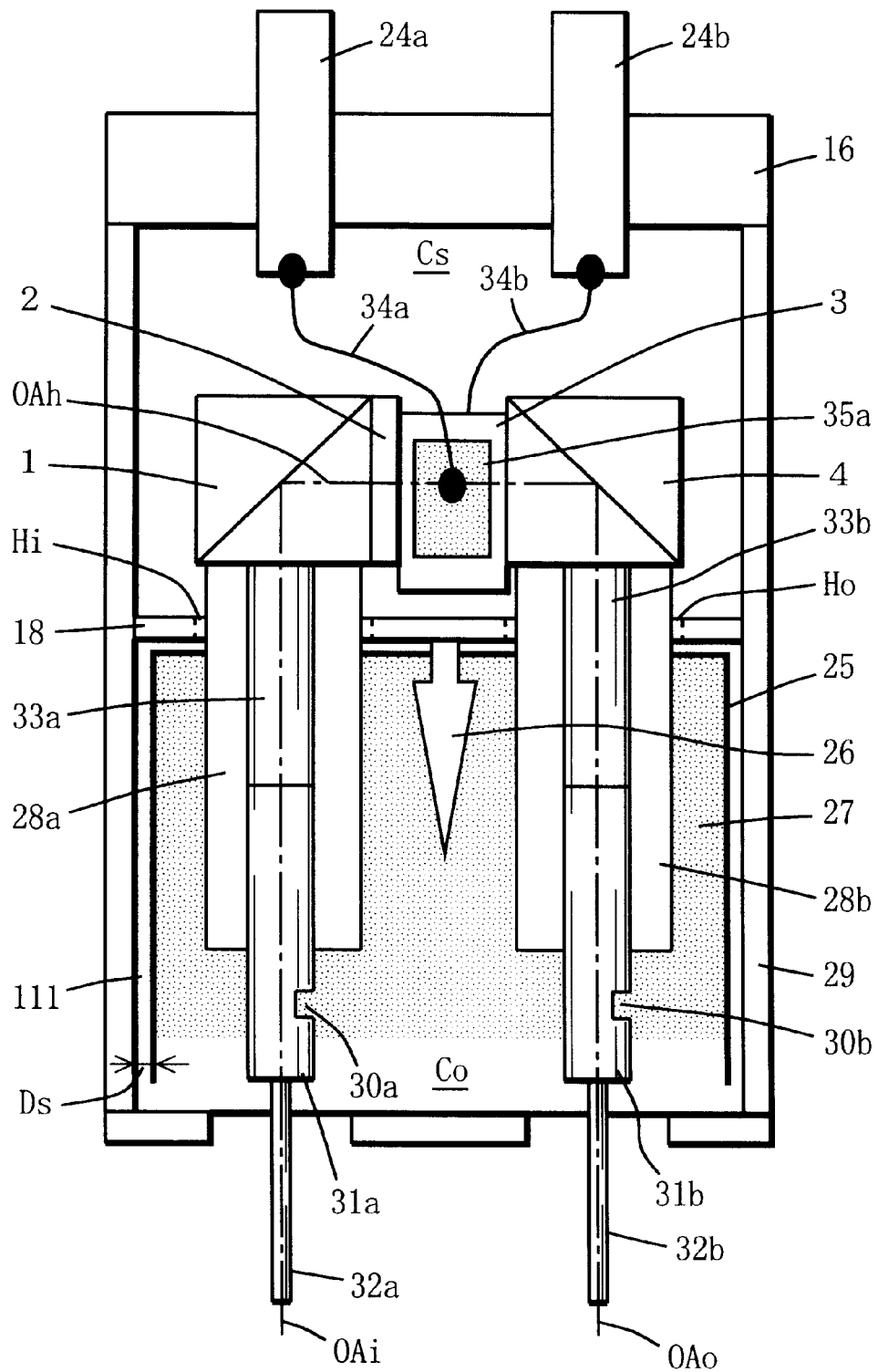
FIG. 16 is a perspective front view showing an optical voltage sensor of a seventh embodiment simplified in structure.

FIG. 16 is a perspective front view showing the optical voltage sensor of the seventh embodiment simplified in structure. The optical voltage sensor also includes the sensor part, the light emission part, the light reception part, and the signal processing circuits provided each on the light emission and reception sides (both not shown). The sensor part has the polarizer 1, the λ/4 plate 2, the electro-optic crystal 3, and the analyzer 4 arranged in order of light incidence on an optical axis OAh. As the polarizer 1 and the analyzer 4 are used a right-angle PBS (Polarization Beam Splitter). The light emission part includes the E/O circuit (not shown) including a light source, and is also provided with the input side optical system including the optical fiber 32a, a ferrule 31a, the GRIN lens 33a, and the holder 28a, all of which are arranged on an optical axis OAi perpendicular to the optical axis OAh. The light reception part is structured by the output side optical system in the same manner as with the input side optical system, and the O/E circuit (not shown) including a converting element converts a beam emitted from the output side optical system into an electrical signal.

Among these optical components, a head section is structured by every optical component in the sensor part, the GRIN lens 33a, the optical fiber 32a, the ferrule 31a, and the holder 28a in the input side optical system in the light emission part, and the GRIN lens 33b, the optical fiber 32b, a ferrule 31b, and the holder 28b in the output side optical system in the light reception part.

The head section is housed in a case 29, and is innerly divided into two regions of a sensor region Cs and an optical region Co by a partition 18 which is approximately perpendicular to both optical axes OAi and OAo but parallel to the optical axis OAh. The partition 18 has two holes of Hi and Ho, and the holder 28a of the input side optical system and the holder 28b of the output side optical system are respectively inserted thereinto not to abut the partition 18 in the house 29. The bottom side of the partition 18, that is, the side opposing to the sensor region Cs, is fixedly attached with a rod 26 almost in the middle of the two holes Hi and Ho. The rod 26 is extending in the direction almost parallel to the optical axes OAi and OAo. The holder 28a of the input side optical system is innerly provided with the GRIN lens 33a, and into the holder 28a, the optical fiber 32a having the ferrule 31a at the tip is inserted and fixed. The ferrule 31a is provided with a recess 30a on a side to which neither the GRIN lens 33a nor the holder 28a abuts. The holder 28b of the output side optical system is structured in the same manner as with the holder 28a of the output side optical system.

In the input side optical system, the optical axes are adjusted between the optical fiber 32a and the GRIN lens 33a with the mechanical accuracy of the holder 28a and the ferrule 31a, and the same is applicable to the output side optical system. In the seventh embodiment, such optical axis adjustment is carried out so that the center axis of the core of the optical fiber 32a comes to the optical power stabilizing position, as in the fifth embodiment, and the center axes of the optical fiber 32b and the GRIN lens 33b coincide with each other. In an alternate manner, the optical axis adjustment may be carried out so that the center axes of the optical fiber 32a and the GRIN lens 33a coincide with each other, and the center axis of the core of the optical fiber 32b is displaced in the direction of −45° parallel to the optical axis as in the sixth embodiment. To be more specific, assuming that the electro-optic crystal 3 is the $LiNbO_3$ crystal, the center axis of the core of the optical fiber 32b is displaced in the direction of −45° parallel to the optical axis so that the reception part selectively receives beam strands coming into the electro-optic crystal 3. This is done by adjusting the optical axes between the optical fiber 32b and the GRIN lens 33b so that any beam strand with which the fast axis of the electro-optic crystal 3 ($LiNbO_3$ crystal) is directed to −45° is only received.

As to the optical components in both the light emission and reception parts, optical axis planes adjacent to each other are bonded by an optically transparent adhesive. As to the optical components in the sensor part, on the other hand, optical axis planes adjacent to each other are not bonded by the adhesive but retained by friction therebetween. In detail, by friction between the optical axis plane on light emission side of the polarizer 1 (right-angle PBS) and the optical axis plane on light reception side of the λ/4 plate 2, between the optical axis plane on light emission side of the λ/4 plate 2 and the optical axis plane on light reception side of the electro-optic crystal 3, and between the optical axis plane on light emission side of the electro-optic crystal 3 and the optical axis plane on light emission side of the analyzer 4 (right-angle PBS), the λ/4 plate 2 and the electro-optic crystal 3 are securely retained between the polarizer 1 and the analyzer 4.

As to the electro-optic crystal 3 placed in the sensor region Cs in the head section, to each side parallel to the optical axis OAh, electrodes 35a and 35b (not shown) are respectively evaporated. The electrodes 35a and 35b are electrically connected to a pair of electrode terminals 24a and 24b, respectively, via lead wires 34a and 34b. The electrode terminals 24a and 24b are both fixed to a lid 16 of the case 29, and the voltage Vm is externally applied therebetween.

The holders 28a and 28b and the rod 26 are integrally fixed by a block 27 in one piece. The block 27 is formed by first enclosing the holders 28a and 28b and the rod 26 with a filter paper 25, and then by filling an aqueous inorganic adhesive AS having ceramic as the main ingredient in a given manner thereinto for curing. At the time of block forming, the inorganic adhesive also fills the recess 30a provided on the portion of the ferrule 31a not abutting to the holder 28a and a recess 30b on the portion of the ferrule 31b not abutting to the holder 28b, and then cures. Herein, between the cured block 27 and the inner wall of the case 29, a gap 111 is provided so as to space those by a space Ds. The gap 111 is for preventing, even if the block 27 expands due to temperature change, any stress from imposing on other optical components in the head section due to abutment between the block 27 and the inner wall of the case 29. For this purpose, the space Ds (a width of the gap 111) is properly determined based on a thermal expansion coefficient for the block 27 and a temperature range applicable to the environment under which the optical voltage sensor is used.

As an example, with the thermal expansion coefficient for the cured block 27 being $20\times10^{-6}/°$ C. or below, and the temperature range of −20° C. to 80° C., the space Ds is preferably about 0.2 mm. The head section is structured by inorganic materials such as glass having an expansion rate of $10^{-6}$ level, and the case 29 preferably by heat-resistance ABS resin having the expansion rate of $10^{-6}$ level. As such, with proper materials, the case 29 is free from being abutted by other optical components in the optical voltage sensor in the temperature range of −20° C. to 80° C.

Further, as described above, the holders 28a and 28b and the rod 26 are integrally fixed in one piece by the inorganic adhesive having ceramic as the main ingredient, and accordingly the head section is fixed, without abutting, to the partition 18 through the rod 26 as is obvious from the above. Thereafter, on the case 29 having the head section attached through the rod 26, the lid 16 having attached with the electrode terminals 24a and 24b to which the electrodes 35a and 35b evaporated onto the electro-optic crystal 3 are connected via the lead wires 34a and 34b is placed.

Still further, as described in the foregoing, the block 27 is formed by the inorganic adhesive AS having the thermal expansion rate of about the same as those for the optical components in the sensor part. Accordingly, even if any difference of the thermal expansion rate is observed for the block 27 and the sensor part in the direction of the optical axis OAh, the difference can be suppressed to be substantially negligible. Thus, even if the block 27 thermally expands due to temperature change, the polarizer 1 and the analyzer 4 do not move apart from each other and thus the polarizer 1, the λ/4 plate 2, the electro-optic crystal 3, and the analyzer 4 remain retained. Similarly, even if the block 27 thermally shrinks, the polarizer 1 and the analyzer 4 do not move closer and thus these optical components do not suffer too much stress. As such, it is possible to prevent any stress from occurring due to any difference in the thermal expansion coefficient between the block 27 and the sensor part, and thus the undesired temperature dependence is prevented. It is also possible to prevent the optical axis from being angularly-deviated in the sensor part due to such stress. This is especially important in the case that the temperature dependence is reduced by specifically setting the angular deviation for the beam coming into the electro-optic crystal 3 as in the first embodiment.

Still further, at the time of block forming, the recesses 30a and 30b on the ferrules 31a and 31b are also filled with the inorganic adhesive AS, and become a part of the block 27. Therefore, the ferrules 31a and 31b are fixedly inserted in the holders 28a and 28b, respectively, and thus may not fall off.

Figure 17:
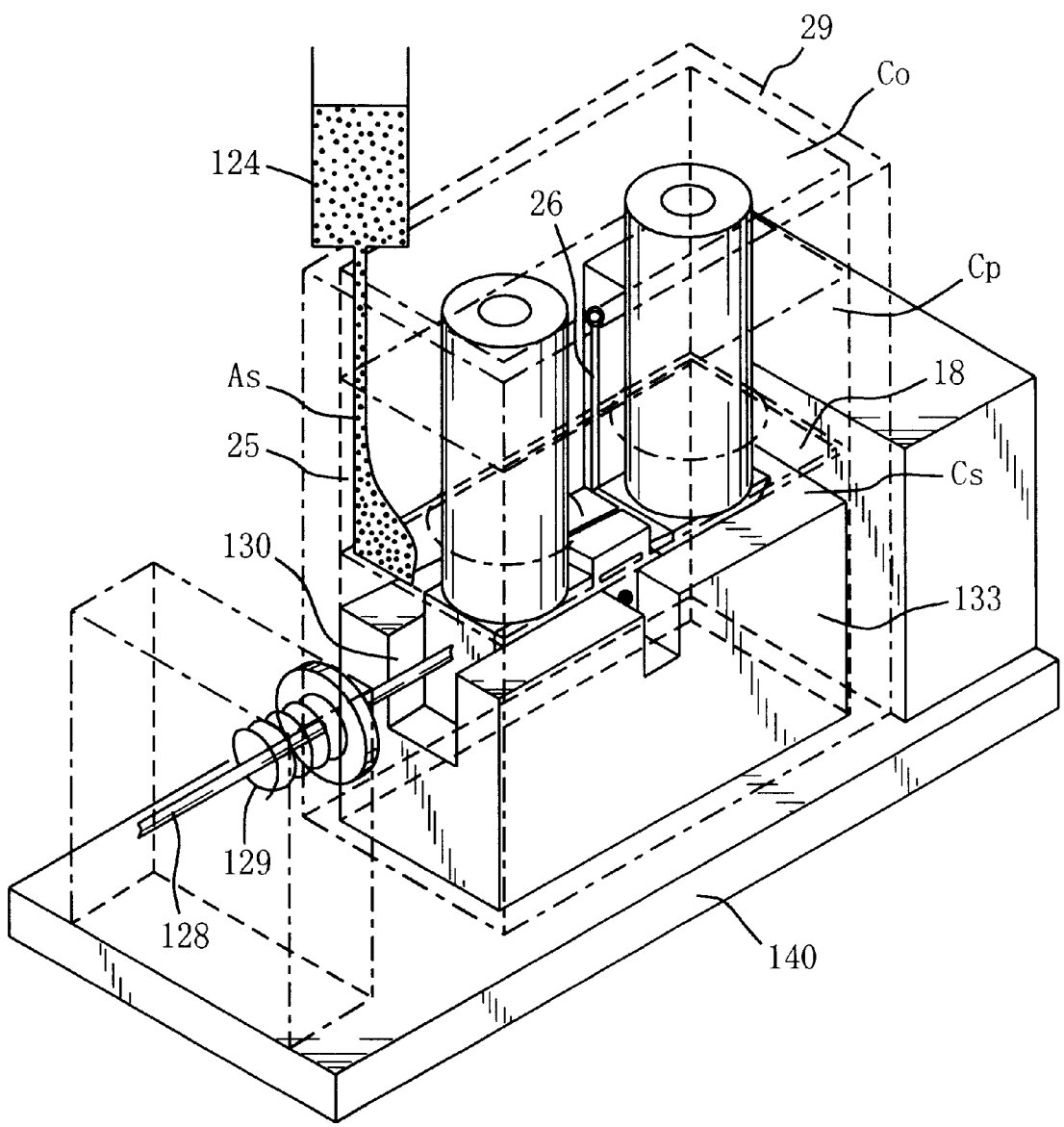
FIG. 17 is a diagram for explaining how to form a block for the optical voltage sensor of the seventh embodiment.

It is now described how to assemble the optical voltage sensor of this embodiment with reference to FIG. 17. First of all, the optical axis plane on light reception side of the polarizer 1 and the optical axis plane on light emission side of the holder 28a are attached to each other by an optical adhesive, exemplarily by an epoxy synthetic resin. In a similar manner, the optical axis plane on light reception side of the analyzer 4 and the optical axis plane on light emission side of the holder 28b are attached to each other. Herein, the polarizer 1 and the analyzer 4 are both the right-angle PBS, and each secure the right angle of the optical axis plane with respect to the optical axes OAi and OAh, and OAh and OAo, respectively.

Second, the polarizer 1, the λ/4 plate 2, the electro-optic crystal 3, and the analyzer 4 are arranged on an optical axis adjustment groove 130 in this order. At this time, the holders 28a and 28b including the GRIN lens 33a and 33b, respectively, are placed upward, i.e., the upper side of the polarizer 1 is placed downward. After the optical axes are coincided with each other, by using a part presser bar 128 which is supported by a temporary presser spring 129 and a block wall 133 which is on the opposite side to the part presser bar 128, external force having a proper resilience is applied to both the polarizer 1 and the analyzer 4 in the non-parallel direction to the optical axis. The resilience thereof is originally in the parallel direction to the optical axis. In this manner, the polarizer 1 attached with the holder 28a innerly including the GRIN lens, the λ/4 plate 2, the electro-optic crystal 3, and the analyzer 4 attached with the holder 28b innerly including the GRIN lens are temporarily fixed, and thus the head section except for the ferrules 31a and 31b, and the optical fibers 32a and 32b are structured.

The head section temporarily fixed on an assembly plate 140 is covered with the case 29 having the partition 18 therein. Then, the holders 28a and 28b with the GRIN lenses are inserted into the two holes cut in the partition 18 so that the holders 28a and 28b protrude into the optical region Co side. The filter paper 25 is then arranged along the inner wall of the case 29 only for the optical region Co. The filter paper 25 in the direction of the optical axes OAi and OAo covers the length from the lower side of the partition 18 to the recesses 30a and 30b of the holders 28a and 28b and the rod 26, but not long enough to cover the length from the partition 18 to the ferrules 31a and 31b.

As such, a space Cp is formed in the optical region Co by the filter paper 25 and the partition 18. After the case 29 is fixed to the assembly plate 140, the space Cp is filled with the aqueous ceramic adhesive AS by using a ceramic dispenser 124. The ceramic adhesive AS is cured by air or heat, and thus the block 27 is formed to retain the holders 28a and 28b together.

The λ/4 plate 2 and the electro-optic crystal 3 which are retained by friction between the polarizer 1 and the analyzer 4 are then released from the optical axis adjustment groove 130 and the external force having the resilience, whereby the head section integrated by the block 27 and the case 29 become free from interaction therebetween. Then, the head section is completed by connecting the holder 28a with the ferrule 31a and the optical fiber 32a, and the holder 28b with the ferrule 31b and the optical fiber 32b. The case 29 is then covered with the lid 16 having the electrode terminals 24a and 24b attached, and the optical voltage sensor is completely assembled.

Figure 18A:
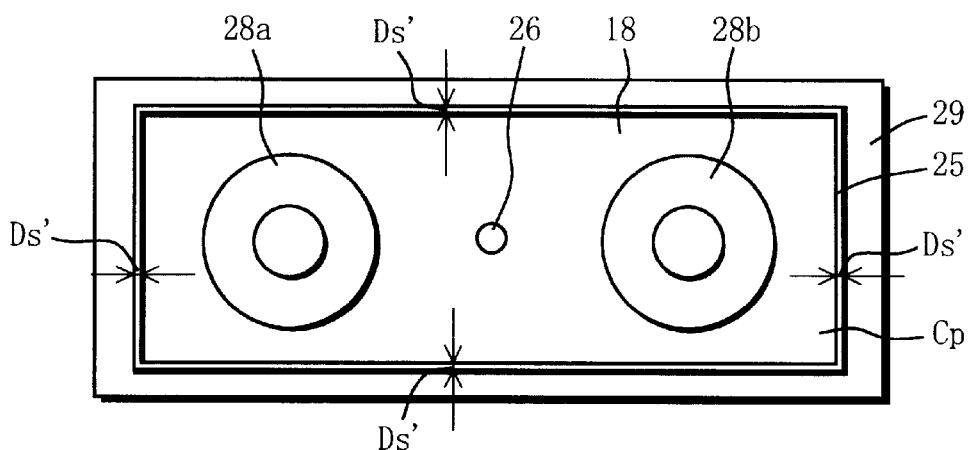
FIGS. 18A to 18C each show how a filter paper helps to generate a gap between a case and the block in the seventh embodiment.
Figure 18B:
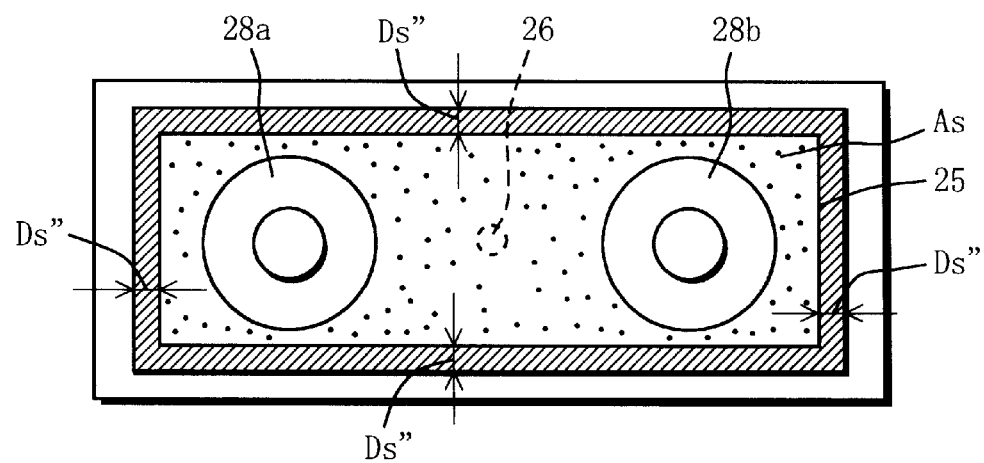
Figure 18C:
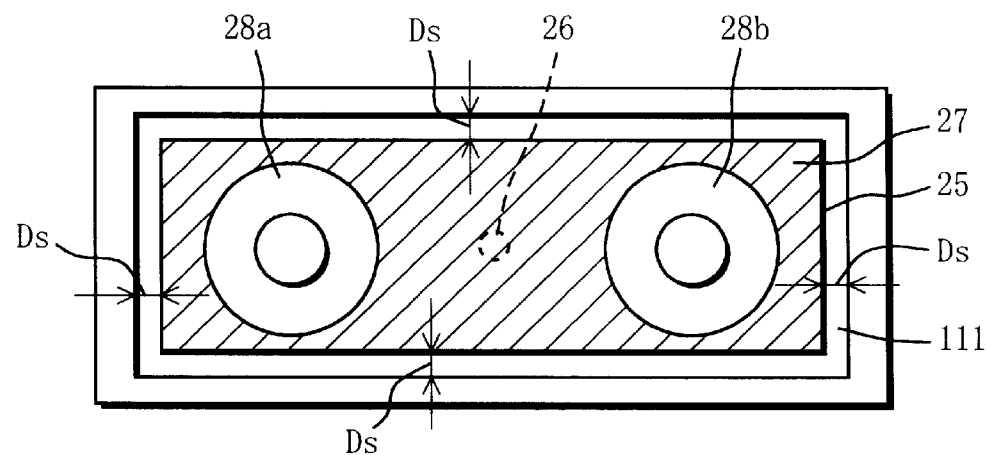

It is now described how the filter paper 25 helps to generate the gap 111 between the case 29 and the block 27 with reference to FIGS. 18A, 18B, and 18C. The FIGS. 18A, 18B, and 18C are plane views each showing the inside of the optical region Co from the holder side in the approximately parallel direction to the optical axes OAi and OAo.

FIG. 18A shows the space Cp formed on the partition 18 by arranging the filter paper 25 along the inner wall of the case 29 only for the optical region Co so as to have a space Ds' between the paper and the inner wall. The space Ds' is predetermined to be larger than 0.

FIG. 18B shows the space Cp with the ceramic adhesive AS filled. The filter paper 25 swells, in other words, gets thicker, with moisture included in the ceramic adhesive AS. The swollen filer paper 25 (hatched area) abuts to the inner wall of the case 29, and accordingly the space between the inner wall of the case 29 and the ceramic adhesive AS is increased. The space at the time when the filter paper 25 is saturated with moisture is determined as a space Ds". Since the filter paper 25 absorbs the moisture included in the ceramic adhesive As, the adhesive thus cures and is almost shaped.

FIG. 18c shows the ceramic adhesive AS cured by air or heat shaped with the filter paper 25. After the ceramic adhesive AS is cured, the moisture in the filter paper 25 gets dry and thus the space Ds" (thickness of the filter paper 25) is decreased. Herein, being mostly cured, the ceramic adhesive AS does not swell toward the inner wall of the case 29 but internally cures. After the ceramic adhesive AS is completely cured, the filter paper 25 becomes apart from the inner wall of the case 29 and sticks to the block 27. Accordingly, the gap 111 is thus generated between the inner wall of the case 29 and the filter paper 25. The gap 111 is equal to the space Ds, which is equivalent to the decreased thickness of the filter paper 25. Thus, such relationship as Ds">Ds>Ds' is satisfied.

This is how the ceramic adhesive AS changes the dimension in the directions both parallel and perpendicular to the optical axis OAh. Similarly in the direction parallel to the optical axes OAi and OAo, the partition 18 in the case 29 and the block 27 may have a gap therebetween with the help of the filter paper 25. Specifically, the ceramic adhesive AS becomes apart from the partition 18 as the filter paper 25 swells (by Ds"), and the ceramic adhesive AS cures and the rod 26 is thus secured therein. Accordingly, the space Ds is thus generated between the partition 18 and the filter paper 25 as the filter paper 25 is reduced in thickness due to evaporation.

As such, the block 27 which integrates the optical components does not directly abut to the case 29 but via the rod 26, whereby the optical components never be affected by deformation of the case 29, for example, any more.

Herein, as the electro-optic crystal 3 is used a crystal such as $Bi_{20}SiO_{20}$(BSO), KDP, or $LiNbO_3$ or $LiTaO_3$ having natural birefringence property as is conventionally done. The angular deviation of the light coming into the electro-optic crystal is reduced to 0.2° or less with a plane-making accuracy of the polarizer 1 and the analyzer 4 being 30 minutes or less, and whereby the temperature dependence due to the angular deviation of the incident light can be reduced. The material for the holders 28a and 28b is preferably an inorganic material which results in less deformation with temperature change, exemplarily ceramic. Alternatively, a metal low in cost may be a possibility for the holders 28a and 28b as far as deterioration in characteristic does not cause any serious problem.

8. Eighth Embodiment

An optical voltage sensor according to an eighth embodiment of the present invention is described.

Figure 19:
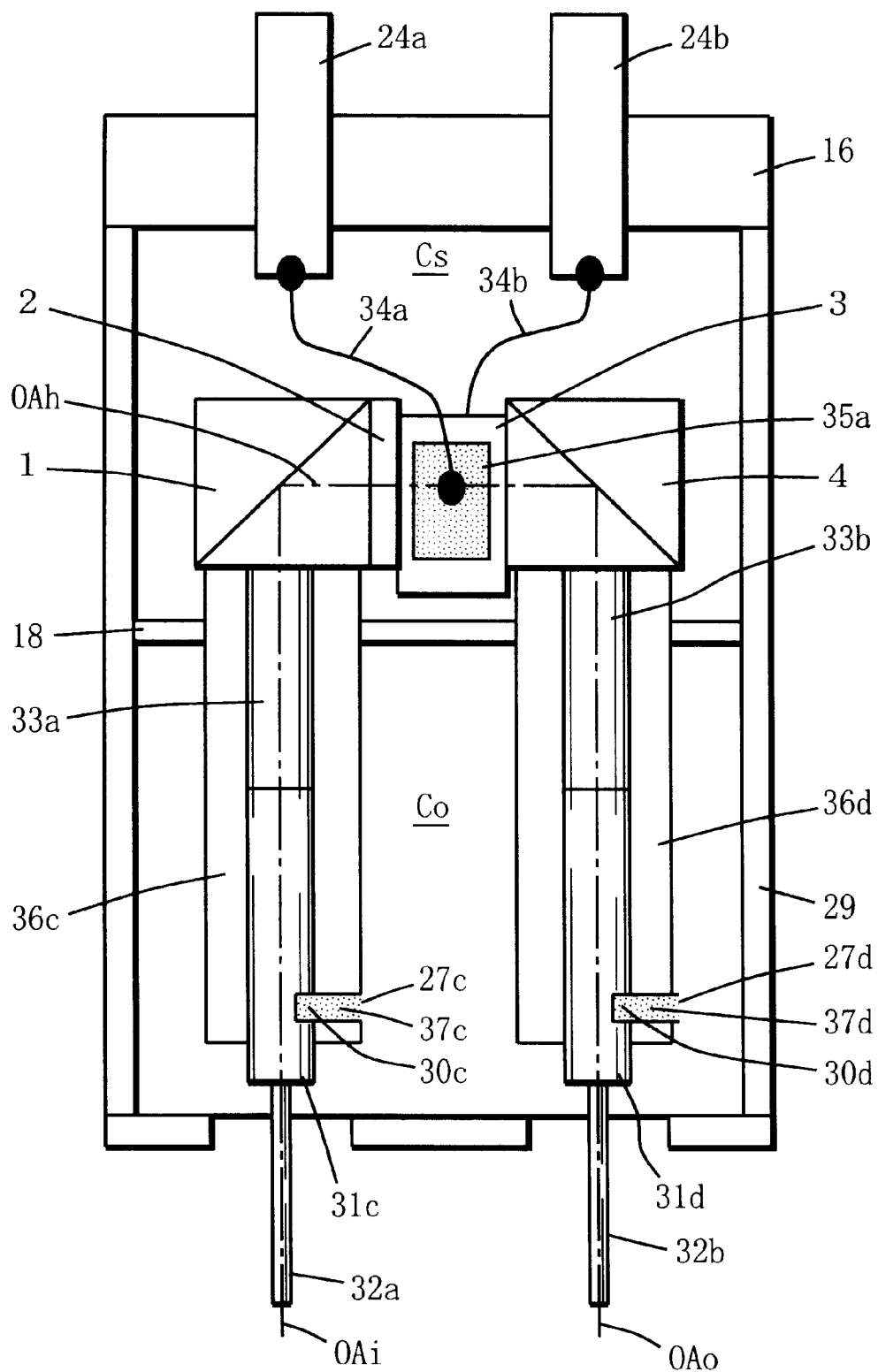
FIG. 19 is a perspective front view showing an optical voltage sensor of an eighth embodiment simplified in structure.

FIG. 19 is a perspective front view showing the optical voltage sensor of the eighth embodiment simplified in structure. The optical voltage sensor also includes the sensor part, the light emission part, the light reception part, and the signal processing circuits provided each on the light emission and reception sides (both not shown). The sensor part has the polarizer 1, the λ/4 plate 2, the electro-optic crystal 3, and the analyzer 4 arranged in order of light incidence on an optical axis OAh as is the sensor part in the seventh embodiment. The light emission part includes the E/O circuit (not shown) including a light source, and is also provided with the input side optical system including the optical fiber 32a, a ferrule 31a, the GRIN lens 33a, and the holder 28a, all of which are arranged on the optical axis OAi perpendicular to the optical axis OAh. The light reception part is structured by the output side optical system in the same manner as with the input side optical system, and the O/E circuit (not shown) including a converting element converts a beam emitted from the output side optical system into an electrical signal. Any constituent appeared in the seventh embodiment is denoted by the same reference numeral, and is not described again.

Among these optical components, the head section is structured by every optical component in the sensor part, the GRIN lens 33a, the optical fiber 32a, a ferrule 31c, and a holder 36c in the input side optical system in the light emission part, and the GRIN lens 33b, the optical fiber 32b, a ferrule 31d, and a holder 36d in the output side optical system in the light reception part.

The head section is housed in the case 29, and is innerly divided into two regions of the sensor region Cs and the optical region Co by the partition 18 which is approximately perpendicular to both optical axes OAi and OAo but parallel to the optical axis OAh as in the seventh embodiment. The partition 18 has two holes, and the holder 36c of the input side optical system and the holder 36d of the output side optical system are respectively inserted therethrough so that the head section is mechanically fixed in the case 29. The holder 36c of the input side optical system is innerly provided with the GRIN lens 33a, and a side face of the holder 36c is provided with a hole 37c in such manner not to abut to the GRIN lens 33a. The GRIN lens 33a is connected to the optical fiber 32a through the ferrule 31c. A side face of the ferrule 31c is provided with a recess 30c in such position as to coincide with the hole 37c when the ferrule 31c is inserted and fixed to the holder 36c. The holder 36d is provided with a hole 37d and a recess 30d in a similar manner to the holder 36a.

These optical axes are adjusted, in the input side optical system, between the optical fiber 32a and the GRIN lens 33a with the mechanical accuracy of the holder 36c and the ferrule 31c, and in the output side optical system, between the optical fiber 32b and the GRIN lens 33b with the mechanical accuracy of the holder 36d and the ferrule 31d. Thereafter, the hole 37c on the holder 36c and the recess 30c on the ferrule 31c are both filled with an adhesive 27c for curing so that the holder 36c and the ferrule 31c are integrated to be a piece. The holder 36d and the ferrule 31d are integrated to be a piece in the same manner as above. As such, the holder and the ferrule can be integrated into one respectively in the input side optical system and the output side optical system. The adhesive for the purpose is preferably the aqueous inorganic adhesive AS having ceramic as the main ingredient as used in the seventh embodiment. The inorganic adhesive is lower in thermal expansion coefficient than a resin adhesive, whereby temperature dependence caused by the angular deviation due to thermal stress, for example, can be reduced.

As described in the foregoing, the hole 37c of the holder 36c and the recess 30c of the ferrule 31d are filled with the inorganic adhesive AS for curing. Therefore, the ferrules 31c and 31d are both fixed in the holder 36c and 36d, thereby being prevented from falling off.

9. Ninth Embodiment

An optical voltage sensor according to a ninth embodiment of the present invention is described.

Figure 20:
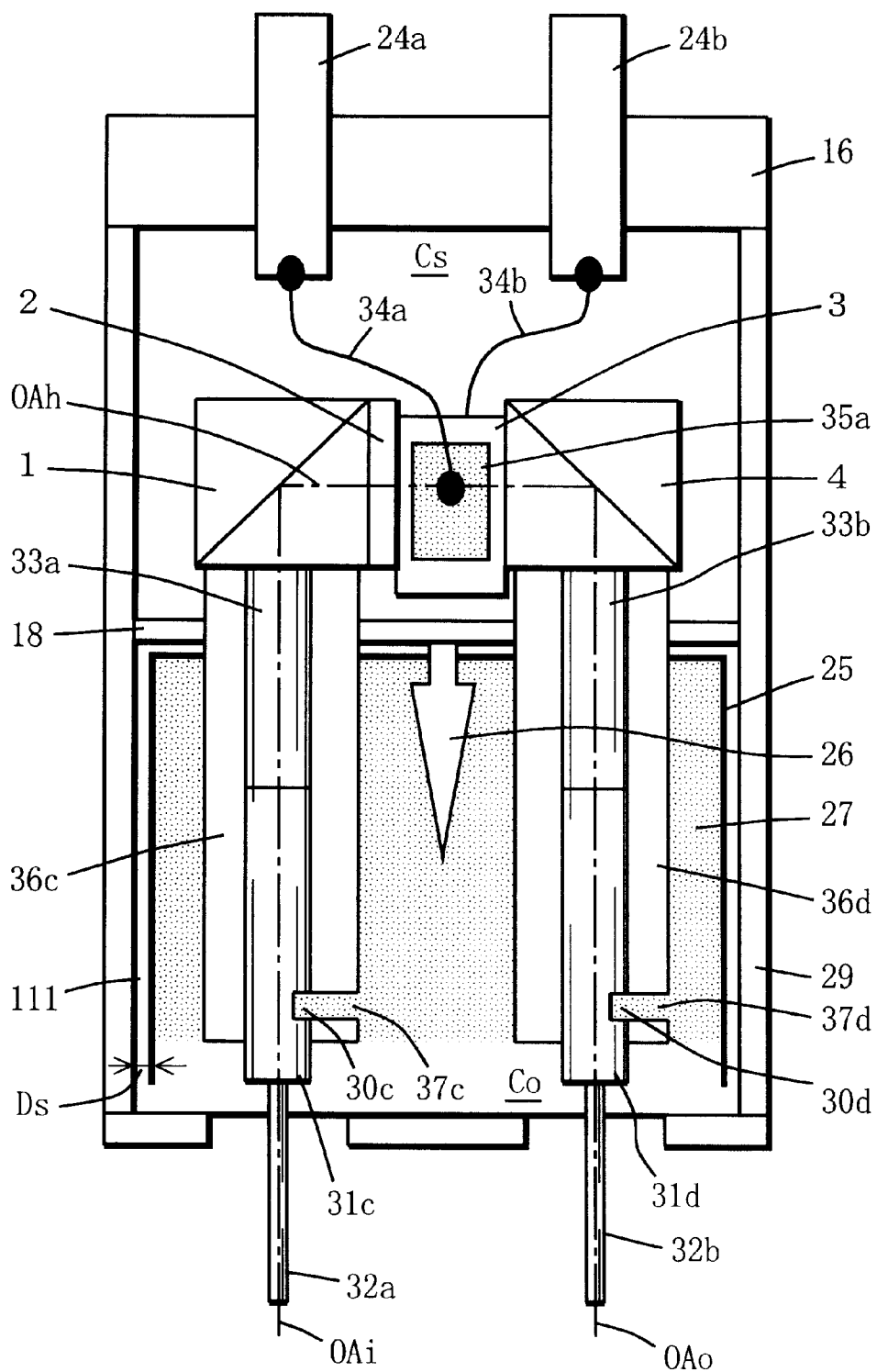
FIG. 20 is a perspective front view showing an optical voltage sensor of a ninth embodiment simplified in structure.

FIG. 20 is a perspective front view showing the optical voltage sensor of the ninth embodiment simplified in structure. The optical voltage sensor of this embodiment is structurally almost similar to the one in the seventh embodiment, and any constituent appeared in the seventh embodiment is denoted by the same reference numeral, and is not described again.

In this embodiment, the holder and the ferrule in the input/output side optical systems are structurally different from those in the seventh embodiment. To be specific, as in the eighth embodiment (unlike the seventh embodiment), the holder 36c including the GRIN lens 33a is provided with the hole 37c on the side face thereof not to abut to the GRIN lens 33a. The GRIN lens 33a is connected to the optical fiber 32a through the ferrule 31c. A side face of the ferrule 31c is provided with the recess 30c in such position as to coincide with the hole 37c when the ferrule 31c is inserted and fixed to the holder 36c. The holder 36d is provided with the hole 37d and the recess 30d in a similar manner to the holder 36a.

In the ninth embodiment, as in the seventh embodiment, the block 27 is formed by first enclosing the holders 36c and 36d and the rod 26 with a filter paper 25, and then by filling the aqueous inorganic adhesive AS having ceramic as the main ingredient in a given manner thereinto for curing. Accordingly, the holders 36c and 36d and the rod 26 are integrated together. At the time of block forming, the optical axes are first adjusted between the optical fiber 32a and the GRIN lens 33a in the input side optical system with the mechanical accuracy of the holder 36c and the ferrule 31c, and then the inorganic adhesive fills the hole 37c on the holder 36c and the recess 30c on the ferrule 31c for curing. The same processing is carried out for the output side optical system. Herein, between the cured block 27 and the inner wall of the case 29, the gap 111 is provided so as to space those by the space Ds. The gap 111 is for preventing, even if the block 27 expands due to temperature change, any stress from being imposed on other optical components in the head section due to abutment between the block 27 and the inner wall of the case 29. For this purpose, the space Ds (a width of the gap 111) is properly determined based on a thermal expansion coefficient for the block 27 and a temperature range applicable to the environment under which the optical voltage sensor is used.

As described above, the block 27 is formed by the inorganic adhesive AS having the thermal expansion rate of about the same as those for the optical components in the sensor part. Accordingly, similar to the seventh embodiment, it is possible to prevent any stress from occurring due to any difference in the thermal expansion coefficient between the block 27 and the sensor part.

Further, as described above, at the time of block forming, the holes 37c and 37d on the holder 36c and 36d, and the recesses 30c and 30d on the ferrules 31c and 31d are also filled with the inorganic adhesive AS, and become a part of the block 27. Therefore, the ferrules 31a and 31b are fixedly inserted in the holders 28a and 28b, respectively, and thus may not fall off.

10. Modified Example

Although the optical voltage sensors in the third to sixth embodiments are supposed to be similar in structure to the conventional optical voltage sensor shown in FIG. 21, instead, preferably similar in structure to the optical voltage sensor in the seventh to ninth embodiment (see FIGS. 16 to 20). In such structure, it is possible to obtain the already-described advantages (e.g., ferrules do not fall off, temperature dependence is reduced by suppressing thermal stress). Similarly, the optical voltage sensors in the first and second embodiments are preferably similar in structure to the one in the seventh to ninth embodiment.

While the invention has been described in detail, the foregoing description is in all aspects illustrative and not restrictive. It is understood that numerous other modifications and variations can be devised without departing from the scope of the invention.

What is claimed is:

1. An optical voltage sensor comprising:
   a light emission part operable to emit a light beam;
   a sensor part having a polarizer, a λ/4 plate, an electro-optic crystal with a birefringence property, and an analyzer arranged on a predetermined optical axis set along an optical path of the light beam; and
   a light reception part operable to receive the light beam which passes said sensor part, and measure a voltage applied to said electro-optic crystal based on the light beam received by said light reception part;
   wherein based on an inherent relationship between a characteristic of said optical voltage sensor and at least one parameter indicating a beam center direction (αc, βc), a beam edge angle distribution ($\theta_{CLN}$) for the beam entering into said electro-optic crystal, at least one of the parameters is set to a predetermined value in advance to improve the characteristic; and
   wherein the parameter indicating the beam center direction of the light beam includes an angular deviation from the optical axis (αc) and an angular deviation on an optical axis plane (βc) that is a plane perpendicular to the optical axis.

2. An optical voltage sensor as claimed in claim 1, wherein said light emission part comprises a light source operable to emit the light beam so as to have a center wavelength in a range of 0.8 μm to 0.9 μm.

3. An optical voltage sensor comprising:
   a light emission part operable to emit a light beam;
   a sensor part having a polarizer, a λ/4 plate, an electro-optic crystal with a birefringence property, and an analyzer arranged on a predetermined optical axis set along an optical path of the light beam; and
   a light reception part operable to receive the light beam which passes said sensor part, and measure a voltage applied to said electro-optic crystal based on the light beam received by said light reception part;
   wherein based on an inherent relationship between a characteristic of said optical voltage sensor and at least one parameter indicating a beam center direction (αc, βc), a beam edge angle distribution ($\theta_{CLN}$) for the beam entering into said electro-optic crystal, at least one of the parameters is set to a predetermined value in advance to improve the characteristic; and
   wherein said λ/4 plate is crystal, said electro-optic crystal is a LiNbO$_3$ crystal whose Z axis is coincident with the optical axis, a central wavelength of the light beam emitted from said light emission part is in a range of 0.8 μm to 0.9 μm, and a beam edge angle ($\theta_{CLN}$) of the light beam when entering into said electro-optic crystal is in a range of 0.8 to 1.4 degrees.

4. An optical voltage sensor as claimed in claim 3, wherein said light reception part comprises a light selective reception device operable to selectively receive, out of the light beam entering into said light reception part via said sensor part, only a partial beam satisfying the range of 0.8 to 1.4 degrees for the beam edge angle ($\theta_{CLN}$) on the LiNbO$_3$ crystal being said electro-optic crystal.

5. An optical voltage sensor as claimed in claim 4, wherein said light selective reception device is an optical fiber having a core diameter or numerical aperture operable to selectively receive only the partial beam.

6. An optical voltage sensor as claimed in claim 4, wherein said light selective reception device is a lens having a diameter or numerical aperture operable to selectively receive only the partial beam.

7. An optical voltage sensor as claimed in claim 3, wherein said light emission part comprises an optical fiber through which the light beam passes, and wherein said optical fiber has a core diameter allowing the light beam to satisfy the range of 0.8 to 1.4 degrees for the beam edge angle ($\theta_{CLN}$) on the LiNbO$_3$ crystal being said electro-optic crystal.

8. An optical voltage sensor as claimed in claim 3, wherein said light emission part comprises:
   a GRIN lens with about 0.25 pitch for a wavelength of the light; and
   an optical fiber whose core diameter is in a range of 0.16 to 0.28 mm;
   wherein the light beam is emitted to said sensor part through said optical fiber and then said GRIN lens.

9. An optical voltage sensor comprising:
   a light emission part operable to emit a light beam;
   a sensor part having a polarizer, a λ/4 plate, an electro-optic crystal with a birefringence property, and an analyzer arranged on a predetermined optical axis set along an optical path of the light beam; and
   a light reception part operable to receive the light beam which passes said sensor part, and measure a voltage applied to said electro-optic crystal based on the light beam received by said light reception part;
   wherein based on an inherent relationship between a characteristic of said optical voltage sensor and at least one parameter indicating a beam center direction (αc, βc), a beam edge angle distribution ($\theta_{CLN}$) for the beam entering into said electro-optic crystal, at least one of the parameters is set to a predetermined value in advance to improve the characteristic; and
   wherein at least one of the parameters is set to the predetermined value by selectively receiving the light beam which has reached said light reception part via said sensor part.

10. An optical voltage sensor as claimed in claim 9, wherein said light emission part comprises a light source operable to emit the light beam so as to have a center wavelength in a range of 0.8 μm to 0.9 μm.

11. An optical voltage sensor comprising:
    a light emission part operable to emit a light beam;
    a sensor part having a polarizer, a λ/4 plate, an electro-optic crystal with a birefringence property, and an analyzer arranged on a predetermined optical axis set along an optical path of the light beam; and
    a light reception part operable to receive the light beam which passes said sensor part, and measure a voltage applied to said electro-optic crystal based on the light beam received by said light reception part;

wherein based on an inherent relationship between a characteristic of said optical voltage sensor and at least one parameter indicating a beam center direction ($\alpha c$, $\beta c$), a beam edge angle distribution ($\theta_{CLN}$) for the beam entering into said electro-optic crystal, at least one of the parameters is set to a predetermined value in advance to improve the characteristic;

wherein said light emission part comprises:
a first lens;
a first holder in which said first lens is housed;
a first optical fiber which leads the light beam to said sensor part via said first lens; and
a first ferrule attached at the tip of said first optical fiber, inserted and fixed in said first holder, and provided with a recess on a portion not abutting either said first lens or said first holder;

wherein optical axes are adjusted between said first optical fiber and said first lens with a mechanical accuracy of said first holder and said first ferrule;

wherein said light reception part comprises:
a second lens;
a second holder in which said second lens is housed;
a second optical fiber which leads the light beam coming from said sensor part via said second lens; and
a second ferrule which is attached at the tip of said second optical fiber, inserted and fixed in said second holder, and has a recess on a portion not abutting either said second lens or said second holder; and wherein optical axes are adjusted between said second optical fiber and said second lens with the mechanical accuracy of said second holder and said second ferrule, and said first and second holders and said first and second ferrules are integrated together by filling, for curing, an adhesive to a region enclosing said first and second holders and said first and second ferrules, and to said recesses on said first and second ferrules.

12. An optical voltage sensor as claimed in claim 11, wherein said adhesive is an inorganic adhesive having an inorganic material as a main ingredient, and portions of said first and second holders and said first and second ferrules abutting said adhesive are made of the inorganic material.

13. An optical voltage sensor as claimed in claim 12, wherein said adhesive is the inorganic adhesive whose thermal expansion coefficient after curing is $20 \times 10^{-6}/°$ C. or below.

14. An optical voltage sensor as claimed in claim 11, wherein said light emission part is operable to emit the light beam so as to have a center wavelength in a range of 0.8 $\mu$m to 0.9 $\mu$m.

15. An optical voltage sensor comprising:
a light emission part operable to emit a light beam;
a sensor part having a polarizer, a $\lambda/4$ plate, an electro-optic crystal with a birefringence property, and an analyzer arranged on a predetermined optical axis set along an optical path of the light beam; and
a light reception part operable to receive the light beam which passes said sensor part, and measure a voltage applied to said electro-optic crystal based on the light beam received by said light reception part;
wherein based on an inherent relationship between a characteristic of said optical voltage sensor and at least one parameter indicating a beam center direction ($\alpha c$, $\beta c$), a beam edge angle distribution ($\theta_{CLN}$) for the beam entering into said electro-optic crystal, at least one of the parameters is set to a predetermined value in advance to improve the characteristic;

wherein said light emission part comprises:
a first lens;
a first holder housing said first lens therein, and having a hole on a portion not abutting said first lens;
a first optical fiber which leads the light beam to said sensor part via said first lens; and
a first ferrule attached at the tip of said first optical fiber, inserted and fixed in said first holder, and provided with a recess on a portion where the hole on said first holder coincides therewith;

wherein optical axes are adjusted between said first optical fiber and said first lens with a mechanical accuracy of said first holder and said first ferrule;

wherein said light reception part comprises:
a second lens;
a second holder housing said second lens therein, and having a hole on a portion not abutting said second lens;
a second optical fiber which leads the light beam coming from said sensor part via said second lens; and
a second ferrule attached at the tip of said second optical fiber, inserted and fixed in said second holder, and provided with a recess on a portion where the hole on said second holder is coincident therewith; and wherein optical axes are adjusted between said second optical fiber and said second lens with a mechanical accuracy of said second holder and said second ferrule, and said first holder and said first ferrule are integrated together by filling, for curing, an adhesive to the hole on said first holder and said recess on said first ferrule, and said second holder and said second ferrule are integrated together by filling, for curing, an adhesive to the hole on said second holder and said recess on said second ferrule.

16. An optical voltage sensor as claimed in claim 15, wherein said light emission part is operable to emit the light beam so as to have a center wavelength in a range of 0.8 $\mu$m to 0.9 $\mu$m.

17. An optical voltage sensor comprising:
a light emission part operable to emit a light beam;
a sensor part having a polarizer, a $\lambda/4$ plate, an electro-optic crystal with a birefringence property, and an analyzer arranged on a predetermined optical axis set along an optical path of the light beam; and
a light reception part operable to receive the light beam which passes said sensor part, and measure a voltage applied to said electro-optic crystal based on the light beam received by said light reception part;
wherein based on an inherent relationship between a characteristic of said optical voltage sensor and at least one parameter indicating a beam center direction ($\alpha c$, $\beta c$), a beam edge angle distribution ($\theta_{CLN}$) for the beam entering into said electro-optic crystal, at least one of the parameters is set to a predetermined value in advance to improve the characteristic;

wherein said light emission part comprises:
a first lens;
a first holder housing said first lens therein, and having a hole on a portion not abutting said first lens;
a first optical fiber which leads the light beam to said sensor part via said first lens; and
a first ferrule attached at the tip of said first optical fiber, inserted and fixed in said first holder, and provided with a recess on a portion where the hole on said first holder is coicident therewith;

wherein optical axes are adjusted between said first optical fiber and said first lens with a mechanical accuracy of said first holder and said first ferrule;

wherein said light reception part comprises:
  a second lens;
  a second holder housing said second lens therein, and having a hole on a portion not abutting said second lens;
  a second optical fiber which leads said light beam coming from said sensor part via said second lens; and
  a second ferrule attached at the tip of said second optical fiber, inserted and fixed in said second holder, and provided with a recess on a portion where the hole on said second holder is coincident therewith; and wherein optical axes are adjusted between said second optical fiber and said second lens with a mechanical accuracy of said second holder and said second ferrule, and said first and second holders and said first and second ferrules are integrated together by filling, for curing, an adhesive to a region enclosing said first and second holders and said first and second ferrules, and to the holes on said first and second holders and said recesses on said first and second ferrules.

18. An optical voltage sensor as claimed in claim 17, wherein said adhesive is an inorganic adhesive having an inorganic material as a main ingredient, and portions of said first and second holders and said first and second ferrules abutting said adhesive are made of the inorganic material.

19. An optical voltage sensor as claimed in claim 17, wherein said light emission part is operable to emit the light beam so as to have a center wavelength in a range of 0.8 $\mu$m to 0.9 $\mu$m.

20. An optical voltage sensor comprising:
  a light emission part operable to emit a light beam;
  a sensor part having a polarizer, a $\lambda/4$ plate, an electro-optic crystal with a birefringence property, and an analyzer arranged on a predetermined optical axis set along an optical path of the light beam; and
  a light reception part operable to receive the light beam which passes said sensor part, and measure a voltage applied to said electro-optic crystal based on the light beam received by said light reception part;
  wherein, when said polarizer and said analyzer are parallel to each other in a polarizing direction, a center of the light beam in said light emission part is set in a position displaced by a predetermined distance in a first direction so that a fast axis of said electro-optic crystal having a birefringence property and a fast axis of said $\lambda/4$ plate having the birefringence property are perpendicular to each other on a reference plane of the light beam; and
  wherein, when said polarizer and said analyzer are perpendicular to each other in polarizing direction, the center of the light beam in said light emission part is set in a position displaced by a predetermined distance in a second direction so that the fast axis of said electro-optic crystal having the birefringence property and the fast axis of said $\lambda/4$ plate having the birefringence property are parallel to each other on the reference plane of the light beam.

21. An optical voltage sensor as claimed in claim 20, wherein said light emission part comprises an optical fiber and a lens through which the light beam passes, wherein the center of the light beam in said light emission part is set by placing a center axis of a core of said optical fiber on a displaced position in the first or second directions parallel to an optical axis of said lens, and wherein the displaced position is a position where an optical power of the light beam to be received by said light reception part is maximum.

22. An optical voltage sensor as claimed in claim 20, wherein said light emission part comprises a light source operable to emit the light beam so as to have a center wavelength in a range of 0.8 $\mu$m to 0.9 $\mu$m.

23. An optical voltage sensor comprising:
  a light emission part operable to emit a light beam;
  a sensor part having a polarizer, a $\lambda/4$ plate, an electro-optic crystal with a birefringence property, and an analyzer arranged on a predetermined optical axis set along an optical path of the light beam; and
  a light reception part operable to receive the light beam which passes said sensor part, and measure a voltage applied to said electro-optic crystal based on the light beam received by said light reception part;
  wherein said light reception part comprises a light selective reception device operable to selectively receive only a partial beam out of the light beam entering into said light reception part via said sensor part;
  wherein said light selective reception device is operable to selectively receive the partial beam when:
    said polarizer and said analyzer are parallel to each other in a polarizing direction in a manner such that a fast axis of said electro-optic crystal having a birefringence property and a fast axis of said $\lambda/4$ plate having the birefringence property are approximately perpendicular to each other on a reference plane for each of a plurality of beam strands structuring the partial beam; and
    said polarizer and said analyzer are perpendicular to each other in a polarizing direction in a manner such that the fast axis of said electro-optic crystal having the birefringence property and the fast axis of said $\lambda/4$ plate having the birefringence property are approximately parallel to each other on the reference plane for each of the plurality of beam strands structuring the partial beam.

24. An optical voltage sensor as claimed in claim 23, wherein said light reception part comprises:
  a lens through which the light beam passes; and
  an optical fiber, as said light selective reception device, operable to selectively receive the light beam which has passed through said lens;
  wherein a center axis of a core of said optical fiber is placed on a displaced position in a direction where the partial beam is selectively received and parallel to an optical axis of said lens, and wherein the displaced position is a position where an optical power of the light beam to be received by said light reception part is maximum.

25. An optical voltage sensor as claimed in claim 23, wherein said light emission part comprises a light source operable to emit the light beam so as to have a center wavelength in a range of 0.8 $\mu$m to 0.9 $\mu$m.

* * * * *